US008724727B2

(12) United States Patent
Oteri et al.

(10) Patent No.: US 8,724,727 B2
(45) Date of Patent: May 13, 2014

(54) SYSTEM AND METHOD FOR OUTER LOOP LINK ADAPTATION FOR A WIRELESS COMMUNICATIONS SYSTEM

(75) Inventors: Oghenekome Oteri, San Diego, CA (US); Cornelius van Rensburg, Wylie, TX (US); Anthony C. K. Soong, Plano, TX (US)

(73) Assignee: Futurewei Technologies, Inc., Plano, TX (US)

( * ) Notice: Subject to any disclaimer, the term of this patent is extended or adjusted under 35 U.S.C. 154(b) by 994 days.

(21) Appl. No.: 12/775,361

(22) Filed: May 6, 2010

(65) Prior Publication Data

US 2010/0284454 A1 Nov. 11, 2010

Related U.S. Application Data

(60) Provisional application No. 61/176,021, filed on May 6, 2009, provisional application No. 61/219,270, filed on Jun. 22, 2009.

(51) Int. Cl.
*H04L 1/20* (2006.01)

(52) U.S. Cl.
USPC ........................................................ 375/267

(58) Field of Classification Search
USPC ......... 375/135, 146, 241, 242, 254, 259–262, 375/264–267, 286–288, 295–299
See application file for complete search history.

(56) References Cited

U.S. PATENT DOCUMENTS

| | | | |
|---|---|---|---|
| 2002/0060997 A1 | 5/2002 | Hwang | |
| 2007/0140363 A1 | 6/2007 | Horng et al. | |
| 2007/0286239 A1* | 12/2007 | Baggen et al. | 370/479 |
| 2008/0037675 A1* | 2/2008 | Lin et al. | 375/262 |
| 2008/0080634 A1* | 4/2008 | Kotecha et al. | 375/267 |
| 2008/0101321 A1* | 5/2008 | Cheng et al. | 370/342 |
| 2008/0192718 A1* | 8/2008 | Jongren et al. | 370/342 |
| 2008/0267158 A1* | 10/2008 | Zhang et al. | 370/342 |
| 2008/0273490 A1 | 11/2008 | Sayana et al. | |
| 2009/0180458 A1* | 7/2009 | Roberts | 370/342 |
| 2009/0262856 A1* | 10/2009 | Onggosanusi et al. | 375/267 |
| 2010/0027697 A1* | 2/2010 | Malladi et al. | 375/260 |
| 2011/0122819 A1* | 5/2011 | Jongren et al. | 370/328 |
| 2011/0200088 A1* | 8/2011 | Koslov et al. | 375/227 |

OTHER PUBLICATIONS

"RAN1 Chairman notes," 3GPP TSG RAN WG1, Meeting #56bis, Mar. 23-27, 2009, 18 pages, Seoul, Korea.
Ericsson, "Uplink SU-MIMO in LTE-Advanced," R1-091573, 3Gpp TSG-RAN WG1 #56bis, Mar. 23-27, 2009, 11 pages, Seoul, Korea.
ETSI, "LTE; Evolved Universal Terrestrial Radio Access (E-UTRA); Physical layer procedures," 3GPP TS 36.213 version 8.6.0, Release 8, Apr. 2009, 79 pages.
Huawei, "Uplink Spatial Multiplexing for LTE-A," R1-091279, 3GPP TSG RAN WG1 metting #56bis, Mar. 23-27, 2009, 5 pages, Seoul, Korea.

(Continued)

Primary Examiner — Young T. Tse
(74) Attorney, Agent, or Firm — Slater & Matsil, LLP

(57) ABSTRACT

A system and method for outer loop link adaptation for a wireless communications system are provided. A method for transmitting information includes receiving information to be transmitted, the information includes at least one codeword, encoding the at least one codeword, and transmitting the encoded at least one codeword. The encoding is based on a measurement of a channel being used to transmit the information and performance measurements for the channel.

27 Claims, 21 Drawing Sheets

(56) References Cited

OTHER PUBLICATIONS

Kovacs, I.Z., et al., "Effects of Non-ideal Channel Feedback on Dual-Stream MIMO-OFDMA System Performance," IEEE, 2007, pp. 1852-1856.

LG Electronics, "Further consideration on CW-to-layer mapping for UL SU-MIMO in LTE-A," R1-091215, 3GPP TSG RAN WG1 Meeting #56bis, Mar. 23-27, 2009, pp. 1-6, Seoul, Korea.

Motorola, "EESM Link Error Prediction for EUTRA System Evaluation," R1-050718, 3GPP TSG RAN WG1 #42, Aug. 29-Sep. 2, 2005, pp. 1-14, London, U.K.

Motorola, "MCS and Layer Shifting/Permutation Evaluation for UL-MIMO," R1-091344, TSG-RAN WG1 #56bis, Mar. 23-27, 2009, pp. 1-8, Seoul, South Korea.

Motorola, "UL-MIMO with Antenna Gain Imbalance," R1-090795, TSG-RAN WG1 #56, Feb. 9-13, 2009, pp. 1-7, Athens, Greece.

NTT Docomo, Inc., "Investigation on Layer Mapping and HARQ Spatial Bundling for Uplink SU-MIMO in LTE-Advanced," R1-091488, 3GPP TSG RAN WG1, Meeting #56bis, Mar. 23-27, 2009, pp. 1-9, Seoul, Korea.

Qualcomm Europe, "Further Link Analyses of SU-MIMO Operation for UL of LTE-A," R1-092067, 3GPP TSG-RAN WG1 #57, May 4-8, 2009, pp. 1-7, San Francisco, CA.

Qualcomm Europe, "Link Analyses of SU-MIMO for UL of LTE-A," R1-091628, 3GPP TSG-RAN WG1 #56bis, Mar. 23-27, 2009, pp. 1-5, Seoul, Korea.

Samsung, "Further discussion on UL MIMO for LTE-Advanced," R1-091243, 3GPP TSG RAN WG1, Meeting #56bis, Mar. 23-27, 2009, 8 pages, Seoul, Korea.

"IEEE Standard for Information technology—Telecommunications and information exchange between systems—Local and metropolitan area networks—Specific requirements, Part 11: Wireless LAN Medium Access Control (MAC) and Physical Layer (PHY) Specifications, Amendment 5: Enhancements for Higher Throughout," IEEE Std 802.11n™—2009, IEEE Computer Society, Sponsored by LAN/MAN Standards Committee, Oct. 29, 2009, 536 pages.

"IEEE Standard for Local and metropolitan area networks, Part 16: Air Interface for Fixed and Mobile Broadband Wireless Access Systems, Amendment 2: Physical and Medium Access Control Layers for Combined Fixed and Mobile Operation in Licensed Bands and Corrigendum 1," IEEE Std 802.16e™—2005 and IEEE Std 802.16™—2004/Cor1-2005, IEEE Computer Society and IEEE Microwave Theory and Techniques Society, Sponsored by the LAN/MAN Standards Committee, Feb. 28, 2006, 864 pages.

\* cited by examiner $$y = Hs + n$$
$$= h_1 s_1 + h_2 s_2 + n$$

where $y \sim M_R \times 1$, $H \sim M_R \times M_T$,
$h_i \sim M_R \times 1$, $n \sim M_R \times 1$, $s \sim M_T \times 1$ and $s \sim 1 \times 1$.
$n \sim \mathcal{N}(0, N_o)$

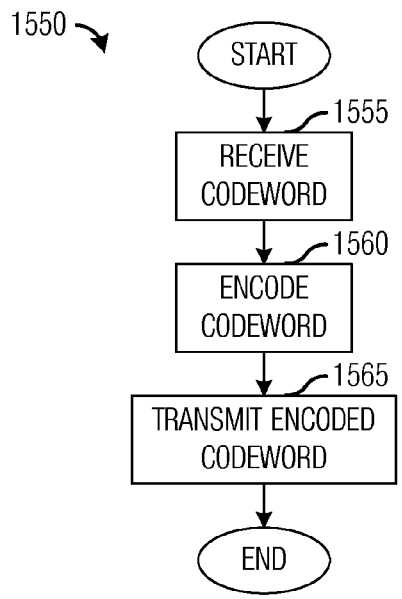

*Fig. 15b*

```
If (track_throughput_mode == low_speed)
Average_throughput = Track_average_throughput_of_system();
If (num_frames > X)
        Track_throughput_mode = 0;
    End
Elseif (track_throughput_mode == high_speed)
If (Doppler_measure > Doppler_target)
        If (average_throughput >= store_average_throughput)
            Buffer_size_old = buffer_size
            Buffer_size = Buffer_size + 1;
            Store_average_throughput = average_throughtput;
            Track_throughput_mode = high_speed;
        Elseif (new_average_throughput < store_average_throughput)
            Buffer_size = buffer_size_old
            Store_average_throughput = average_throughtput;
            Track_throughput_mode = high_speed;
Elseif (Doppler_measure < Doppler_target)
        If (average_throughput >= store_average_throughput)
            Buffer_size_old = buffer_size
            Buffer_size = Buffer_size - 1;            % minimum is 1;
            Store_average_throughput = average_throughtput;
            Track_throughput_mode = high_speed ;
        Elseif (new_average_throughput < store_average_throughput)
            Buffer_size = buffer_size_old
            Store_average_throughput = average_throughput;
            Track_throughput_mode = high_speed;
```

*Fig. 16*

SYSTEM AND METHOD FOR OUTER LOOP LINK ADAPTATION FOR A WIRELESS COMMUNICATIONS SYSTEM

This application claims the benefit of U.S. Provisional Application No. 61/176,021, filed on May 6, 2009, entitled "Method of Outer Loop Link Adaptation that is Robust to a Changing Environment," and U.S. Provisional Application No. 61/219,270, filed on Jun. 22, 2009, entitled "System and Method for Outer Loop Link Adaptation for a Wireless Communications System," which applications are hereby incorporated herein by reference.

TECHNICAL FIELD

The present invention relates generally to a wireless communications, and more particularly to a system and method for outer loop link adaptation for a wireless communications system.

BACKGROUND

Multiple-input multiple-output (MIMO) technology exploits the spatial components of the wireless channel to provide capacity gain and increased link robustness. After almost a decade of research, MIMO wireless communication has finally been adopted in several standards including IEEE 802.16e-2005 and IEEE 802.11n; products based on draft standards are already shipping. MIMO is often combined with OFDM (orthogonal frequency division multiplexing), a type of digital modulation that makes it easy to equalize broadband channels.

In MIMO communication systems, at the transmitter, data are modulated, encoded, and mapped onto spatial signals, which are transmitted from multiple transmit antennas. A main difference with non-MIMO communication systems is that there are many different spatial formatting modes for example beamforming, precoding, spatial multiplexing, space-time coding, and limited feedback precoding, among others. The spatial formatting techniques have different performance (in terms of capacity, goodput, achievable rate, or bit error rate for example) in different channel environments. Consequently, an advantageous component of MIMO wireless systems is adapting the transmitted rate in response to channel conditions in what is known as space-time adaptation, link adaptation, or adaptive space-time modulation.

In MIMO communication systems, space-time link adaptation involves adapting the transmitter in response to channel quality information to maximize a performance measure. As one example, prior work considers the joint adaptation of the modulation and coding rate with the spatial formatting to achieve a target performance measure. For example, the transmitter may switch between a spatial multiplexing spatial formatting method and a spatial diversity spatial formatting method. Switching between spatial formatting methods substantially improves performance in MIMO wireless communication systems. The high throughput advantages of spatial multiplexing can be achieved when the spatial channel is sufficiently rich while the robustness advantages of spatial diversity can be achieved when the channel is severely fading.

Generally, link adaptation is a term used to denote the matching of modulation, coding, and other signal and protocol parameters to conditions on a wireless link. Link adaptation may be a dynamic process and the signal and protocol parameters may change as the wireless link conditions change. For example, wireless link conditions may change as a wireless device moves.

SUMMARY OF THE INVENTION

These and other problems are generally solved or circumvented, and technical advantages are generally achieved, by preferred embodiments of the present invention which provides a system and method for outer loop link adaptation for a wireless communications system.

In accordance with a preferred embodiment of the present invention, a method for transmitting information is provided. The method includes receiving information to be transmitted, the information including at least one codeword, encoding the at least one codeword, and transmitting the encoded at least one codeword. The encoding is based on a measurement of a channel being used to transmit the information and performance measurements for the channel.

In accordance with another preferred embodiment of the present invention, a method for transmitting information is provided. The method includes receiving information to be transmitted, the information includes at least one codeword, encoding the at least one codeword for transmission over two layers, and transmitting the encoded at least one codeword. The encoding is based on a measurement of a channel being used to transmit the information and estimated error information for the channel, and the encoding includes layer shifting and acknowledgement bundling.

In accordance with another preferred embodiment of the present invention, method for transmitter operations is provided. The method includes determining a measurement of a channel, determining link adaptation offsets for each of two layers of the channel, encoding information based on the link adaptation offsets, and transmitting the encoded information. The link adaptation offsets are determined based on an ordering of the two layers.

An advantage of a preferred embodiment of the present invention is that long term performance measures are considered in the adjustment of offsets used in the selection of modulation and coding schemes. The use of long term performance measures allows for a fine tuning of the performance of the communications system to meet desired goals.

A further advantage of a preferred embodiment of the present invention is that the long term performance measures help to prevent situations wherein the selected modulation and coding scheme bounces between different values due to the communications system being in an unstable operating point.

BRIEF DESCRIPTION OF THE DRAWINGS

For a more complete understanding of the present invention, and the advantages thereof, reference is now made to the following descriptions taken in conjunction with the accompanying drawing, in which:

FIG. 5b is a flow diagram of communications device operations in transmitting information, wherein the transmission is encoded using a link adaptation process as shown in FIG. 5a;

FIG. 15b is a flow diagram of communications device operations in transmitting information, wherein the transmission is encoded using a link adaptation process as shown in FIG. 15a;

FIG. 16 is a diagram of a pseudo-code description of a buffer size adaptation algorithm;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a wireless communications system that supports MIMO communications, such as the Third Generation Partnership Project (3GPP) Long Term Evolution (LTE) compliant wireless communications systems. The invention may also be applied, however, to other wireless communications systems, such as those compliant to 3GPP LTE-Advanced, WiMAX, IEEE 802.16e, IEEE 802.11n, and so forth, technical standards.

Figure 1:
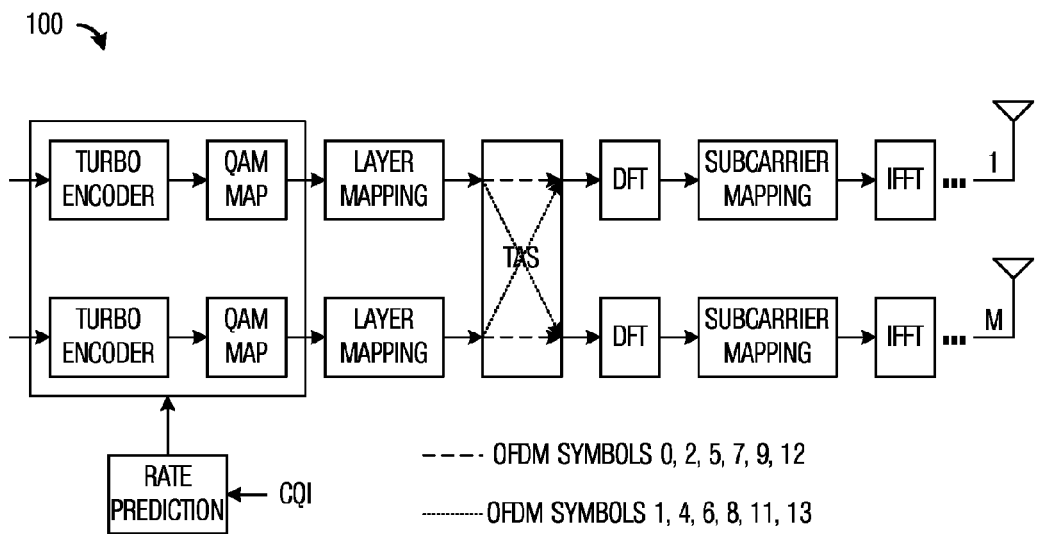
FIG. 1 is a diagram a transmission chain of a first communications device that supports layer shifting.

FIG. 1 illustrates a transmission chain 100 of a first communications device that supports layer shifting. As shown in FIG. 1, transmission chain 100 supports channel coding, modulation, and layer shifting. Transmission chain 100 may be representative of most technical contributions. The operation of transmission chain 100 is referenced herein as scheme one.

Figure 2:
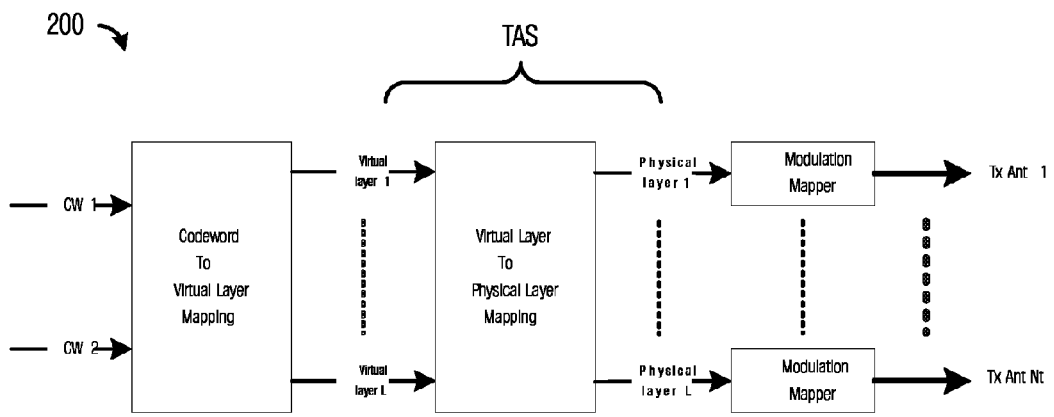
FIG. 2 is a diagram of a transmission chain of a second communications device that supports layer shifting.

FIG. 2 illustrates a transmission chain 200 of a second communications device that supports layer shifting. As shown in FIG. 2, transmission chain 200 supports channel coding, layer shifting, and modulation. The operation of transmission chain 200 is referenced herein as scheme two.

Common understandings shared between transmission chain 100 shown in FIG. 1 and transmission chain 200 shown in FIG. 2 include:

Layer shifting is single carrier frequency division multiple access (SC-FDMA) symbol based to reduce complexity of a communications device, such as a mobile station (MS), user equipment (UE), subscriber, and so forth, compared to other schemes The input of the layer shifting is defined as virtual layer and the output of the layer shifting is defined as physical layer The Layer shifting scheme obeys the following formula for different Uplink MIMO transmission schemes as follows:

$$+\text{Physical Layer Index}=(\text{Virtual Layer Index}+\text{Data SC-FDM Symbol Index})\bmod L,$$

where the L represents the number of the layers for specified uplink MIMO transmission schemes.

Figure 3:
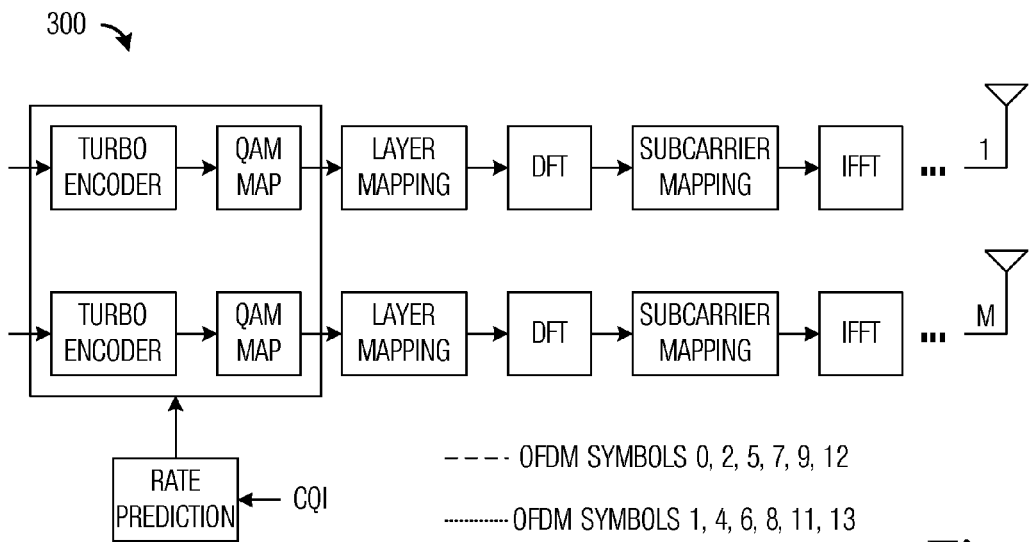
FIG. 3 is a diagram of a transmission chain of a third communications device that does not support layer shifting.

FIG. 3 illustrates a transmission chain 300 of a third communications device that does not support layer shifting. The operation of transmission chain 300 is referenced herein as reference scheme.

The following pros and cons are also listed for these three schemes:

Reference scheme (Transmission chain 300):
  Pros
    Totally keep backward compatibility.
    Robust under an antenna gain imbalance (AGI) scenario.
    No performance difference compared with the scheme one/two under low speed scenario.
  Cons
    Performance loss under high speed scenario.
Scheme One (Transmission chain 100):
  Pros
    Partially Backward compatibility.
  Cons
    Because the modulation is in front of the layer shifting, it will lead to one physical layer corresponding to different modulation schemes, which may lead to the performance loss under the AGI scenario and may therefore be unacceptable in LTE-A compliant wireless communications systems.
Scheme Two (Transmission chain 200):
  Pros
    Robust under the AGI scenario.
  Cons
    Totally breaks backward compatibly.
    Because the modulation is after the layer shifting, the AGI problem may be solved by forcing one physical layer to correspond to one modulation scheme. But scheme two is different from the transmission chain of 3GPP LTE Release-8 (LTE R8) already present, because in LTE R8, one codeword corresponds to one modulation format. However in scheme two, one codeword may corresponding to two or more modulation formats which may have very deep impact on the link adaptation algorithm and TBS table used in LTE R8. Furthermore, scheme two is not a backward compatible scheme that will complicate 3GPP LTE Release-10 (LTE R10) UE design unnecessarily.

Link adaptation will now be described. In order to attain good spectral efficiency, it is desired for a nodeB (NB) (also commonly referred to as an enhanced nodeB, a base station, base terminal station, controller, communications controller, and so forth) to match the modulation and coding scheme transmitted to the quality of the channel in order to maximize the spectral efficiency to every UE individually (often referred to as link adaptation). Typically, for the NB to UE link, link adaptation is done by way of the UE measuring a signal plus interference to noise ratio (SINR) of the link and periodically reporting the measured SINR of the link to the NB, which in turn uses the measured SINR to determine an optimum modulation and coding scheme (MCS) for that UE. For the UE to NB link, the NB measures the received channel (either from a sounding signal or a reference symbol transmitted by the UE) and then determines the MCS for the UE.

Given a sufficiently slowly moving UE and a sufficiently flat channel and a sufficiently stable environment over the reporting interval, the link adaptation method works well. However, typically, the UE may either be moving at a high speed, or its channel may be too selective, or the interference environment may be changing between measuring the SINR of the and transmitting of the data, which necessitates the use of other mechanisms to aid in link adaptation in order to optimize throughput. In previous studies, an outer loop link adaptation (OLLA) has been shown to provide a good mitigation mechanism for the link adaptation errors caused by the imperfect channel quality indication (CQI), a form of measured SINR, feedback information.

Embodiments described herein focus on methods to improve link adaptation based on both a reported SINR as well as a reporting of packet errors (e.g., a packet error rate) and re-transmissions (e.g., a re-transmission rate) in a hybrid automatic repeat request (HARD) process.

Figure 4:
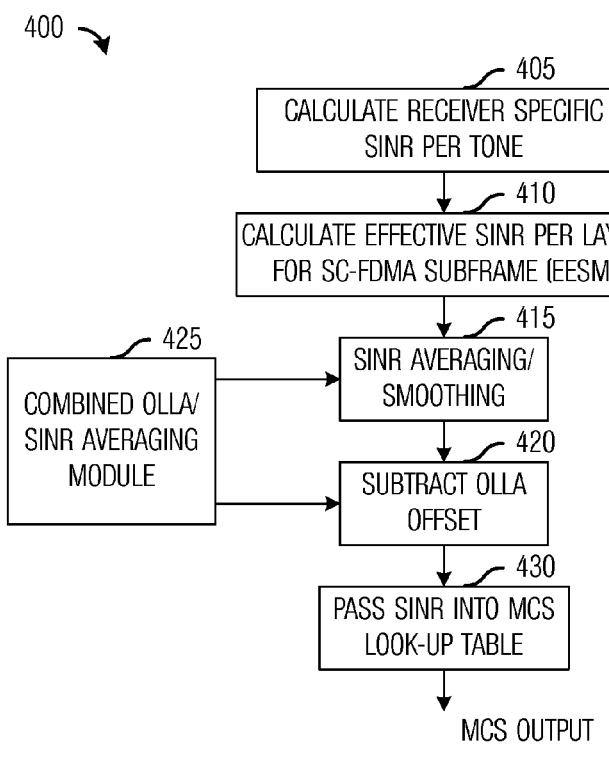
FIG. 4 is a flow diagram of a link adaptation process that makes use of reported SINR as well as packet errors and re-transmissions.

FIG. 4 illustrates a flow diagram of a link adaptation process 400 that makes use of reported SINR as well as packet errors and re-transmissions. Link adaptation process 400 includes calculating a receiver specific SINR per tone (block 405) as well as calculating an effective SINR per layer for SC-FDMA subframe, using exponential effective SIR mapping (EESM), for example (block 410).

SINR averaging and/or smoothing may then be performed (block 415) and an OLLA offset may be subtracted (block 420). Subtracting (and/or adding depending on the sign of the OLLA offset) the OLLA offset may be a way to adjust a behavior of the link adaptation based on the SINR reports and the packet errors and re-transmissions. As an example, if the packet errors indicate that a MCS used in link adaptation is too aggressive and producing too many packet errors, then an OLLA offset may be selected to reduce an aggressiveness of the MCS used in link adaptation. Similarly, if the packet errors indicate that a MCS used in link adaptation is too conservative and producing too few packet errors, then an OLLA offset may be selected to increase an aggressiveness of the MCS used in link adaptation.

The OLLA offset may be determined on a variety of factors, including channel quality measurements, as well performance measures, both long term and short term. Examples of channel quality measurements include reported SINR measurements of the channel, self measured SINR measurements based on sounding signals, signal to noise ratio (SNR) measurements (both reported and self-measured), and so forth. Channel quality measurements provide a quantitative measure of channel conditions.

Performance measures provide an indication of achievable performance on the channel, both long term and short term (or instantaneous), using specified communications system parameters. Performance measures may include packet error rate (PER), frame error rate (FER), bit error rate (BER), throughput, and so forth. The performance measures may be based on the channel quality of the channel plus communications system parameters, such as modulation and coding scheme, and so on, which may be specified by an operator of the communications system.

As its name indicates, long term performance measures may measure the achievable performance of the channel for an extended period of time. For example, a long term measure may be a PER for first packets of each transmission made over the channel, a BER for second packets for each transmission made over the channel, a FER for third frames of each transmission made over the channel, and so on. Short term performance measures may provide an instantaneous view of the performance of the channel. An example of short term performance measures may include an occurrence of a packet error, a frame error, a bit error, a presence of a positive or negative acknowledgement, or so forth.

It may be possible to combine both channel quality measurements and performance measures (both long term performance measures as well as short term performance measures) to improve OLLA performance by setting the SINR offset more precisely to achieve better overall performance. For example, the use of long term performance measures may afford a historical perspective when it comes setting the SINR offset and may help to prevent the occurrence of ping-ponging the SINR offset while the communications system stabilizes.

The OLLA offset, in addition to values used in SINR averaging and/or smoothing, may be provided by a combined OLLA/SINR averaging module (block 425). Combined OLLA/SINR averaging module may provide the OLLA offset and the values used in SINR averaging and/or smoothing based on SINR reports as well as packet errors and re-transmissions (actual values or estimates).

Figure 5A:
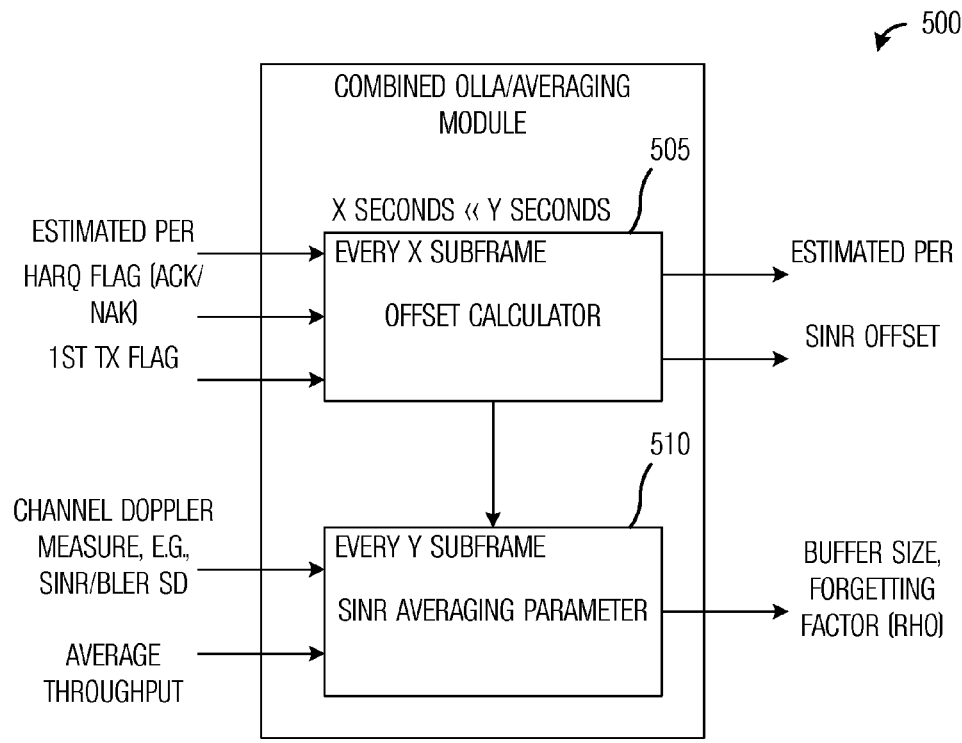
FIG. 5a is a diagram of a detailed view of combined OLLA/SINR averaging module.

FIG. 5a illustrates a detailed view of combined OLLA/SINR averaging module 500. Combined OLLA/SINR averaging module 500 includes an offset calculator 505 and a SINR averaging parameter unit 510. Offset calculator 505 may have as input an estimated packet error rate (PER) that provides an indication of a number of packet errors, a HARQ flag that provides an indication of a number of re-transmissions, and a first transmission flag that may indicate if a transmission is a first transmission of a packet of a sequence of packets. Although the offset calculator 505 is shown to have as input a flag indicating a transmission is a first transmission, alternate embodiments may have flags indicating other transmissions of a sequence.

In general, the inputs to offset calculator 505 may be classified based on their type and nature. As discussed previously, the SINR offset may be based on channel quality measurements and performance measures (both long term and short term). The estimated PER input to offset calculator may be an example of a long term performance measure, while the HARQ flag may be an example of a shorter term performance measure and the first transmission flag may be an example of an indicator of an occurrence of a long term performance measure event. For example, if the long term performance measure is a PER for first packets in a sequence of packets, then the first transmission flag may be asserted for first packets in each sequence of packets transmitted. Similarly, if the long term performance error is a PER for second packets in a sequence of packets, then the first transmission flag may be asserted for second packets in each sequence of packets transmitted.

Although the discussion focuses on the first packet of a sequence of packets, estimated PER, and HARQ ACK/NAKs, the embodiments discussed herein are operable with other forms of long term and short term performance measures and events, such as second, third, fourth, and so on, packets, as well as actual frame, bit, packet, and on forth, errors. Therefore, the discussion of the first packet of a sequence of packets, estimated PER, and HARQ ACK/NAKs should not be construed as being limiting to either the scope or the spirit of the embodiments.

Offset calculator 505 may compute from its inputs an estimated PER as well as an SINR offset to be used to adjust a SINR value used in link adaptation. For example, if the estimate PER is high, the SINR offset may be selected so that the SINR value used in link adaptation is changed so that a MCS scheme selected is less aggressive, thereby reducing a PER. Similarly, if the estimated PER is low, the SINR offset may be selected so that the SINR value used in link adaptation is changed so that a MSC scheme selected is more aggressive, thereby increasing performance.

SINR averaging parameter unit 510 may have as input channel doppler measurements (e.g., SINR, block error rate, statistics based on block error rate, and so forth) and an average throughput. SINR averaging parameter unit 510 may compute a buffer size for use in SINR averaging (i.e., a SINR averaging window size) and/or a forgetting factor (rho) also used in SINR averaging.

According to an embodiment, offset calculator 505 may be configured so that it operates once every X subframes and SINR averaging parameter unit 510 may be configured so that it operates once every Y subframes. X and Y may be selected so that X occurs much more frequently than Y, therefore, updates to the SINR offset may occur with greater frequency than updates to the SINR averaging window size.

Referring back to FIG. 4, the SINR calculated and reported by the UE (or calculated by the NB on an uplink) may depend on the capabilities of the UE's (or NB's) receiver. For example, the SINR may be based on a minimum mean squared error (MMSE) interference rejection capability of the receiver. If the receiver has MMSE-successive interference cancelling (SIC) capability, then the receiver may calculate two SINRs, a first using a MMSE suppression technique and a second may assume that a first stream will be cancelled by SIC operation and will use a more optimal maximal ratio combining (MRC) combining technique, thereby, generally producing a higher SINR value than the SINR produced using MMSE. The receiver may then need to decide which SINR combination to choose. For example, option 1: MMSE SINR layer 1+SIC SINR layer 2 or option 2: SINR layer 1+MMSE SINR layer 2.

The SINR calculations may be computed on a per tone basis, and then combined across a subband including multiple tones using a EESM method, for example. According to an alternative embodiment, simple averaging per tone or averaging mutual information per tone may be performed.

A filter or a moving average may be used to smooth out the effect of SINR variations that may be present in time or over different measurements. SINR variation may be particularly significant in situations with a rapidly moving UE.

Figure 6A:
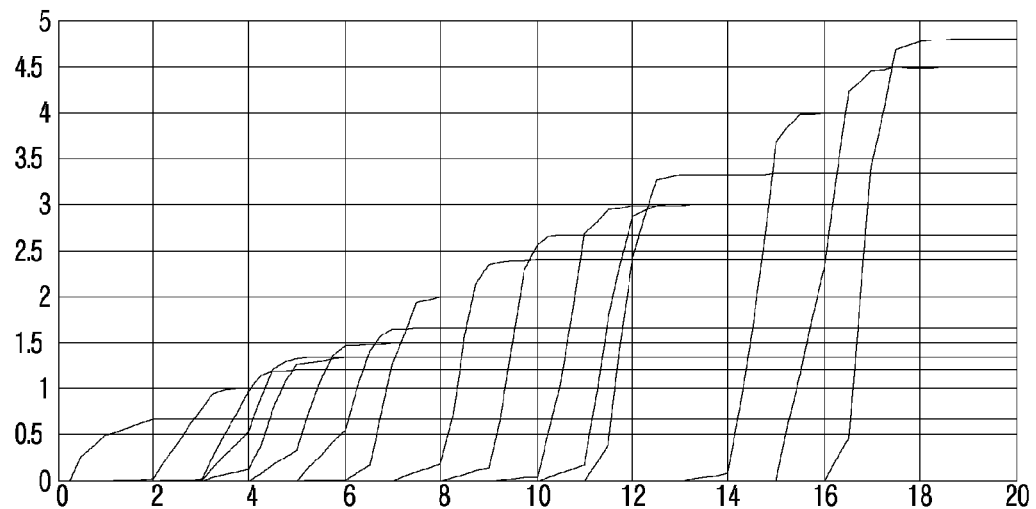
FIGS. 6a and 6b are plots of throughput curves.
Figure 6B:
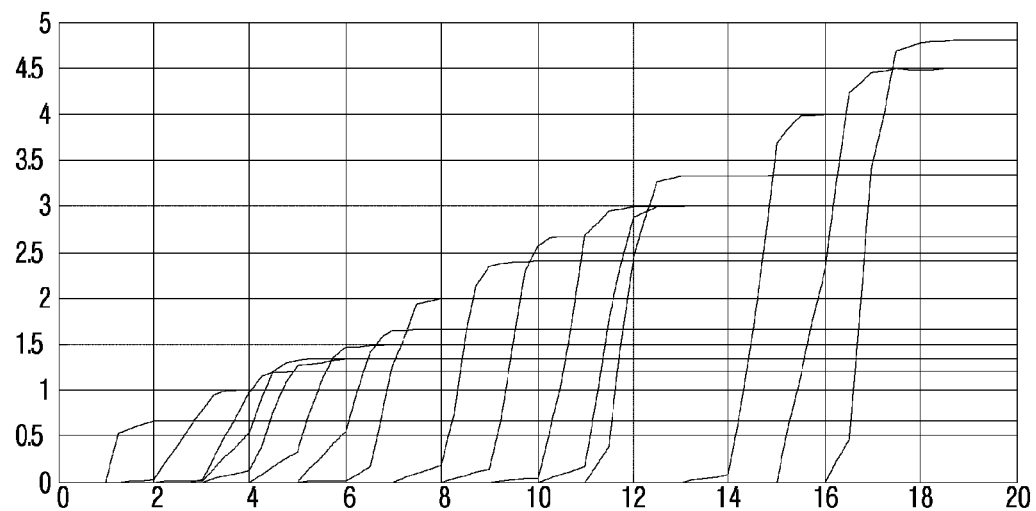

An adjusted SINR value may then be passed to a MCS look-up table (or an MCS selection function) to select a MCS for the link (block 430). An MCS may be selected, wherein the MCS selected may be a MCS that maximizes a throughput given the adjusted SINR. The MCS may be selected in a traditional way from block error rate (BLER) curves or alternatively, the MCS may be selected from throughput curves as shown in FIGS. 6a and 6b. As shown in FIGS. 6a and 6b, throughput curves cut-off MCS levels at desired BLER target. Also, the throughput curves are almost monotonic, i.e., 4-QAM, 16-QAM, 64-QAM.

Figure 5B:
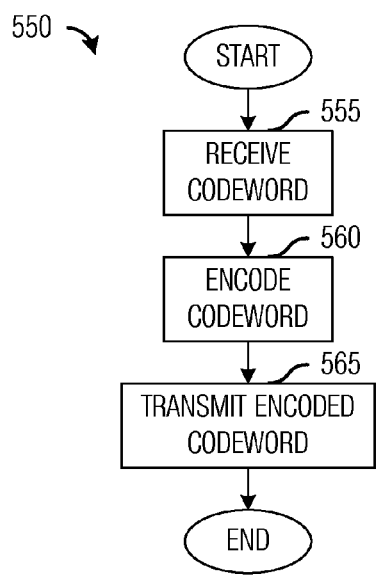

FIG. 5b illustrates a flow diagram of communications device operations 550 in transmitting information, wherein the transmission is encoded using a link adaptation process as shown in FIG. 5a. Communications device operations 550 may be indicative of operations occurring in a communications device, such as a NB of a communications system, as the communications device transmits information to a mobile device served by the communications device. Communications device operations 550 may also be indicative of operations occurring in a communications device, such as a mobile device of a communications system, as the communications device transmits information to a NB serving the communications device.

Communications device operations 550 may begin with the communications device receiving information, in the form of codewords, to transmit (block 555). The information may be generated by the communications device itself, a user of the communications device, an information source coupled to the communications device, or so on.

The communications device may then encode the information, wherein the encoding may include operations such as turbo encoding, QAM mapping, layer mapping, layer shifting, and so forth (block 560). The encoding of the information may be based on channel quality measurements, including a measurement of a channel being used to transmit the information, such as a measured SINR from the communications device or from a recipient of the transmission.

The encoding of the information may also make use of rate prediction information computed based on long term and short term quality measures, such as estimated error information, detected errors, and so forth, related to the channel. Examples of the long term and short term quality measures used in rate prediction may include a measured error rate at specified events over time, an estimated error rate, an estimation error, HARQ ACK/NAKs, and so forth. The rate prediction information generated from the long term and short term quality measures may not make use of HARQ ACK/NAKs that are bundled using NAK bundling. The rate prediction information may be used to select a MCS used in encoding the information, for example.

The encoded information may then be transmitted (block 565). Transmitting the encoded information may include processing of the encoded information, such as domain converting, parallel to serial converting, subcarrier mapping, amplifying, filtering, and so forth, for example. Communications device operations 550 may then terminate.

OLLA allows for tight control of BLER of initial transmissions in rapidly fading environments. It allows for tracking without having to know the long term statistics and/or Doppler behavior of the channel. The NB performs OLLA by using a feedback loop to create an offset to the reported SINR. The feedback loop may be controlled by how close the estimated PER of the current transmission is to a desired target and by HARQ ACK/NAK.

Several design considerations for OLLA may be taken into consideration:

Initial SINR before OLLA: The initial SINR calculated before the OLLA offset is subtracted off should have a fixed relationship between the actual SINR and the estimated SINR to enable OLLA maximize the capacity. Embodiments propose methods to improve SINR smoothening and improving this estimate (the initial SINR).

Step size (an amount of change in the SINR offset) may be an issue for consideration in OLLA: An increase in the SINR offset (up-tick step size) to make the MCS more aggressive may be much larger than a decrease in the SINR offset (down-tick step size) to make the MCS less aggressive. A relationship between the up-tick step size and the down-tick step size may be set as a function of a BLER target.

Different conditions may be set to allow for an up-tick or a down-tick of the SINR offset. An up-tick criterion may be more stringent than a down-tick criterion given that it may be much larger. Up-tick conditions may be based on a desired packet arrival (may be a new packet or a second HARQ packet), a relationship of a NB estimated PER to a desired target, and a failure of the packet to be decoded at current SINR offset levels as indicated by HARQ NAK packets. Down-tick conditions may be based on an arrival of a new packet and a decoding success indicated by a HARQ ACK packet.

The step size (up-tick and/or down-tick) may also be adaptively set based on operating conditions. As an example, when the PER is far from a target PER or during early stages of OLLA operation, the step size (up-tick, down-tick, or both) may be large. Then, as the PER approaches the target PER or as OLLA operation continues for an extended amount of time, the step size (up-tick, down-tick, or both) may decrease. Furthermore, if there is an abrupt change in target PER, the step size may be set to be large values, then over time, the step size may decrease. Adaptive step size may allow for a fine tuning of the SINR offset over time and help to fine tune a convergence of the SINR offset to achieve a desired performance.

PER estimation may be a balance between accuracy (a large number of past samples) and sensitivity (a small number of past samples). Since the PER is estimated, it may be possible to add a PER margin to the estimated PER condition to account for any inaccuracy in the estimated PER.

For stability, a question may be how fast does OLLA converge and how well does OLLA stay at the desired target. Stability may be a function of PER estimation accuracy, step size, and MCS look-up table used in MCS selection.

Figure 7:
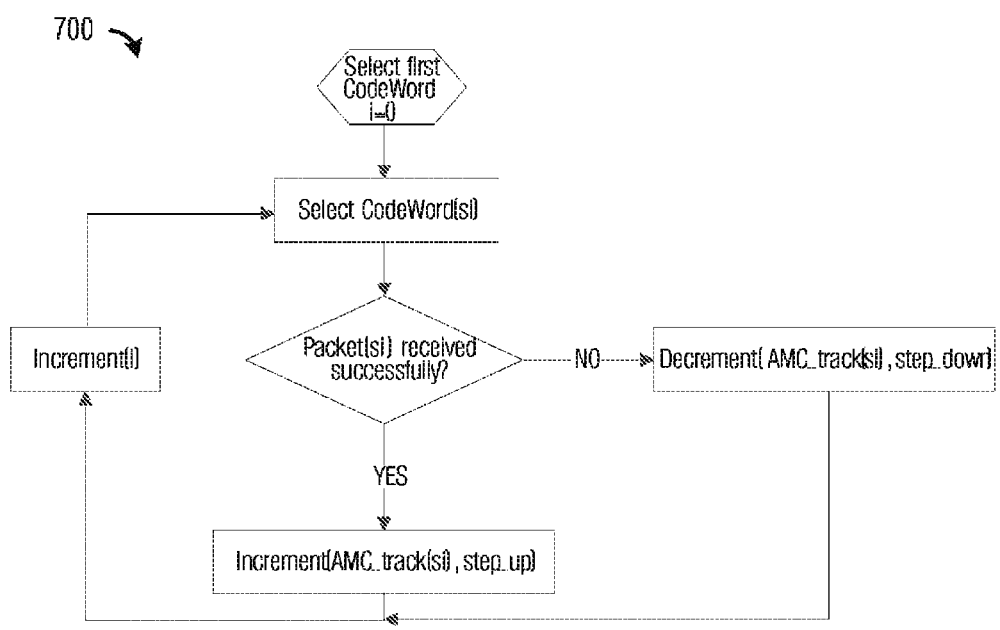
FIG. 7 is a flow diagram of operations in conventional OLLA.

FIG. 7 illustrates a flow diagram of operations 700 in conventional OLLA. Operations 700 include a selection of a codeword si, and transmitting the codeword si. If the codeword si was successfully received, as indicated by a HARQ ACK packet, then the SINR offset may be incremented by an up-tick step size. If the codeword si was not successfully received, as indicated by a HARQ NAK packet, then the SINR offset may be decremented by a down-tick step size. After incremented or decrementing the SINR offset, another codeword may be selected and operations 700 may continue.

Figure 8:
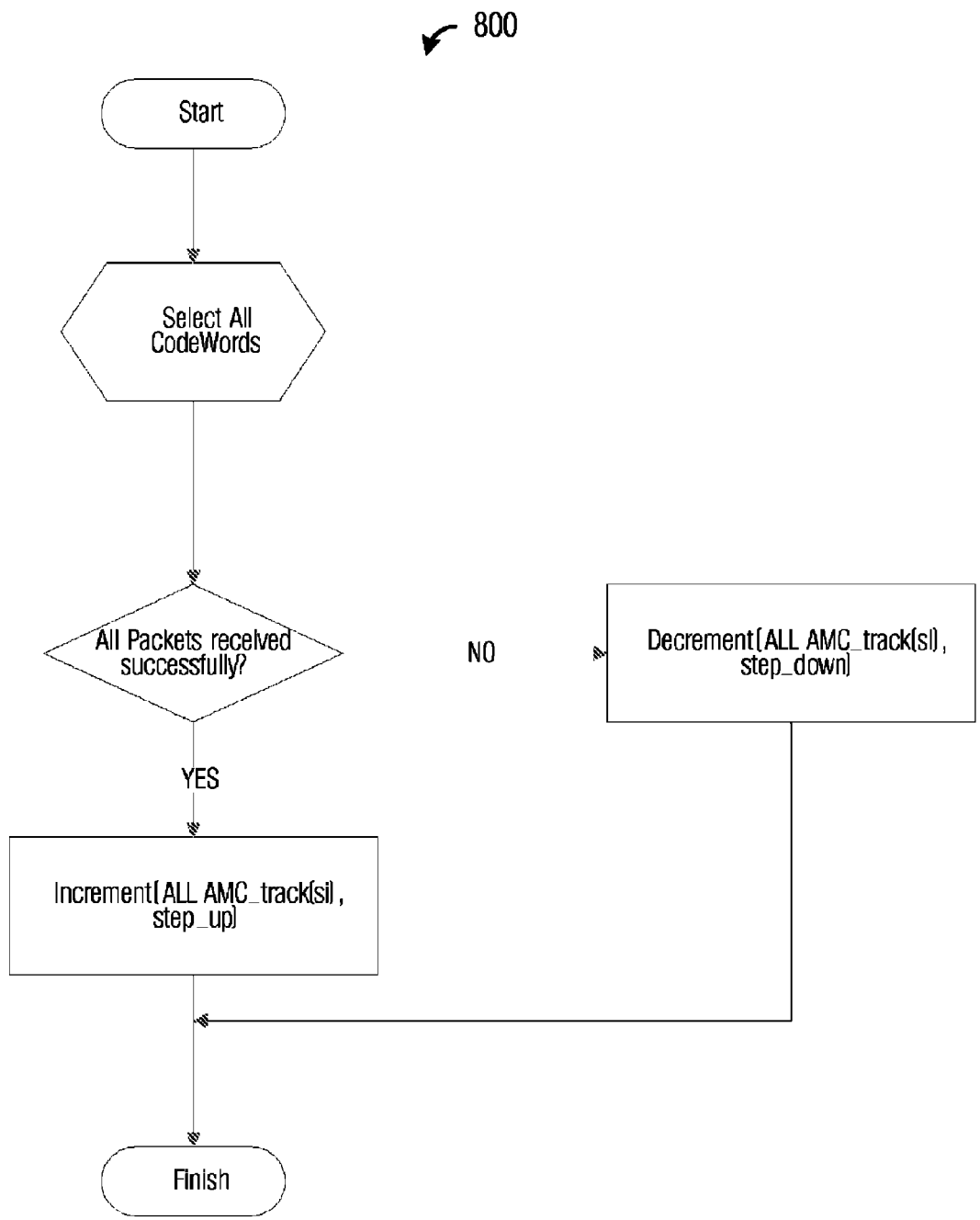
FIG. 8 is a flow diagram of operations in OLLA optimized for spatial multiplexing with layer shifting.

FIG. 8 illustrates a flow diagram of operations 800 in OLLA optimized for spatial multiplexing with layer shifting. With operations 800, incrementing or decrementing the SINR offset may be based on a successful reception of all codewords in a layer. Therefore, the SINR offset is not incremented unless all codewords are successfully received. However, if not all codewords are successfully received, then the SINR offset may be decremented.

Figure 9:
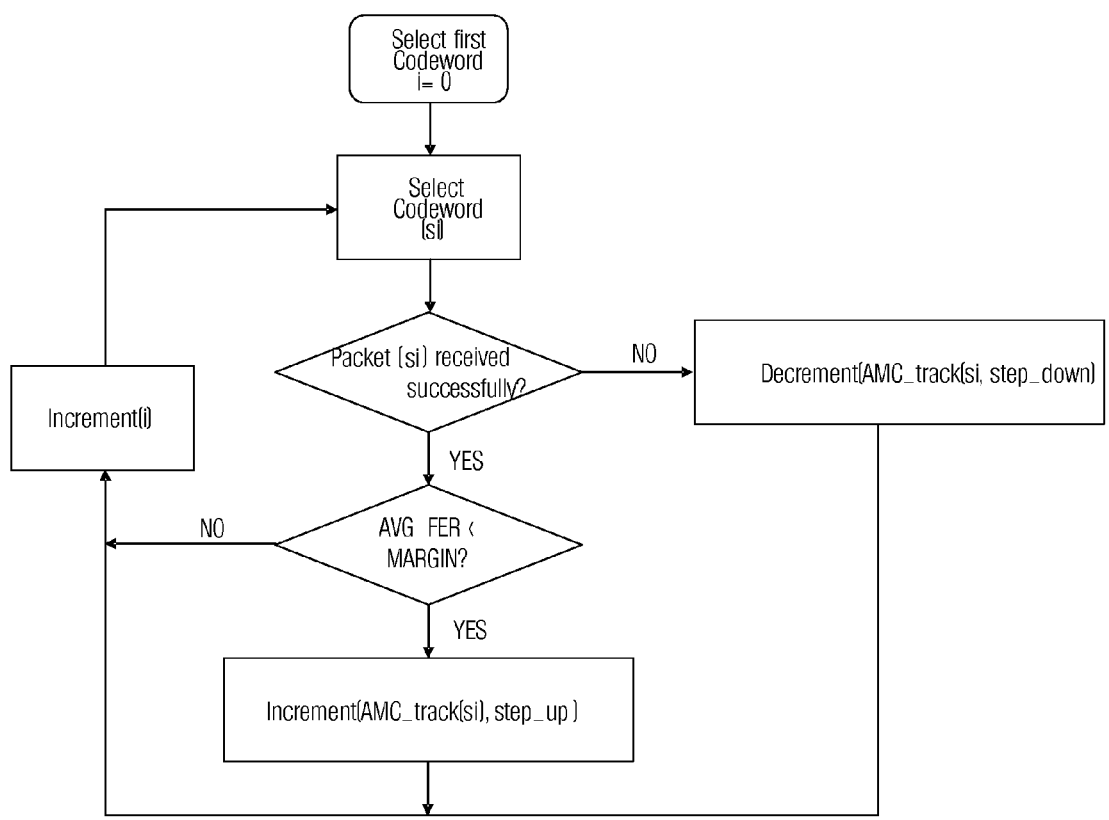
FIG. 9 is a flow diagram of operations in OLLA with an OLLA target based on a soft value rather than a hard FER target.

FIG. 9 illustrates a flow diagram of operations 900 in OLLA with an OLLA target based on a soft value rather than a hard FER target. As shown in FIG. 9, the soft value may be a FER margin that is equal to a target FER plus/minus an error margin. In operations 900, incrementing the SINR offset may not occur unless an FER is less than the target FER. If a packet is successfully received, the SINR offset is incremented only if the FER is also less than the target FER. If the packet is successfully received but the FER is not less than the target FER, then the SINR offset is unchanged. In other words, the SINR offset is incremented (resulting in a selection of a more aggressive MCS) if both long term performance measure conditions (e.g., the FER is less than the target FER) and short term performance measure conditions (e.g., the packet is successfully received) are met. However, if the packet is not successfully received, the SINR offset is decremented without consideration of the FER or the target FER. The SINR offset is decrement (resulting in a selection of a less aggressive MSC) if the short term performance measure condition (e.g., the packet is not successfully received) is met.

According to an embodiment, the target FER may include an adjustment for an expected error in estimating the FER. Since the FER used in adjusting the SINR offset is an estimate instead of an actual FER measurement, there may be an expected difference between the estimated FER and the actual FER. The expected difference may be referred to as an estimation error and may need to be considered in adjusting the SINR offset. The estimation error may be included in the target FER value or the estimation error may be a separate value used in adjusting the SINR offset. As an example, in FIG. 9, where the estimated FER is compared with the margin (i.e., the target FER), the target FER already includes an adjustment due to the estimation error.

In high-level form, operations 900 for independent stream optimization may be written in pseudo-code form as:

```
if ((event1) && (LTPM1 met) && (STPM1 met))
    select more aggressive MCS1
elseif ((event1) && (STPM1 met))
    select less aggressive MCS1
end
if ((event2) && (LTPM2 met) && (STPM2 met))
    select more aggressive MCS2
elseif ((event2) && (STPM2 met))
    select less aggressive MCS2
end.
``` where event1 and event2 are indicators of an occurrence of an event corresponding to a long term performance measure for streams 1 and 2, such as a first packet of a sequence of packets is being transmitted, LTPM1 and LTPM2 are long term performance measure conditions for streams 1 and 2, such as a 10% FER for first packets of each sequence of packets, and STPM1 and STPM2 are short term performance measure for streams 1 and 2, such as an occurrence of an error.

Operations 900 may be written in pseudo-code form for independent stream optimization or joint stream optimization. An exemplary pseudo-code form of operations 900 for independent stream optimization is presented below:

```
if (cond1)
    AMC_doppler_track_1 = AMC_doppler_track_1 + track_step;
elseif (cond3)
    AMC_doppler_track_1 = AMC_doppler_track_1 −
    track_step_down;
end
```

```
    if (cond2)
        AMC_doppler_track_2 = AMC_doppler_track_2 + track_step;
    elseif (cond4)
        AMC_doppler_track_2 = AMC_doppler_track_2 -
            track_step_down;
    end.
``` with cond1=(track_flag1 && (track_FER_1>target+fer_calc_error) && FER1); cond2=(track_flag2 && (track_FER_2>target+fer_calc_error) && FER2); cond3= (track_flag1 && (FER1==0)); and cond4=(track_flag2 && (FER2==0)); where track_flag1 and track_flag2 are transmission tracking indicators for layers 1 and 2, track_FER_1 and track_FER_2 are desired FERs for layers 1 and 2, target is an estimated FER, track_step is an up-tick step size, track_step_down is a down-time step size, fer_calc_error is an estimation error in the estimated FER, and FER1 and FER2 are error rates for layers 1 and 2.

Referencing the pseudo-code form of operations 900 for independent stream optimization presented above, track_flag1 and track_flag2 may be examples of event1 and event2, (track_FER_1>target+fer_calc_error) and (track_FER_2>target+fer_calc_error) && FER2) may be examples of LTPM1 and LTPM2, and FER1 and FER2 may be examples of STPM1 and STPM2.

An exemplary pseudo-code form of operations 900 for joint stream optimization is presented below:

```
if (cond1 && cond2)
    AMC_doppler_track_1 = AMC_doppler_track_1 + track_step;
    AMC_doppler_track_2 = AMC_doppler_track_2 + track_step;|
elseif (cond3 || cond4)
    AMC_doppler_track_1 = AMC_doppler_track_1 -
        track_step_down;
    AMC_doppler_track_2 = AMC_doppler_track_2 -
        track_step_down;
End.
``` with cond1=(track_flag1 && (track_FER_1>target+fer_calc_error) && FER1); cond2=(track_flag2 && (track_FER_2>target+fer_calc_error) && FER2); cond3= (track_flag1 && (FER1==0)); and cond4=(track_flag2 && (FER2==0));
where track_flag1 and track_flag2 are transmission tracking indicators for layers 1 and 2, track_FER_1 and track_FER_2 are estimated FERs for layers 1 and 2, target is a target FER, track_step is an up-tick step size, track_step_down is a down-time step size, fer_calc_error is an expected error between the estimated FER and an actual FER, and FER1 and FER2 are indicators of an occurrence of an error for layers 1 and 2.

The pseudo-code representations of operations 900 shown above make use of conditions for adjusting the SINR offset that do not inherently include the estimation error. Instead, the term fer_calc_error in conditions cond1 and cond2 shown above represent the estimation error.

Figure 10:
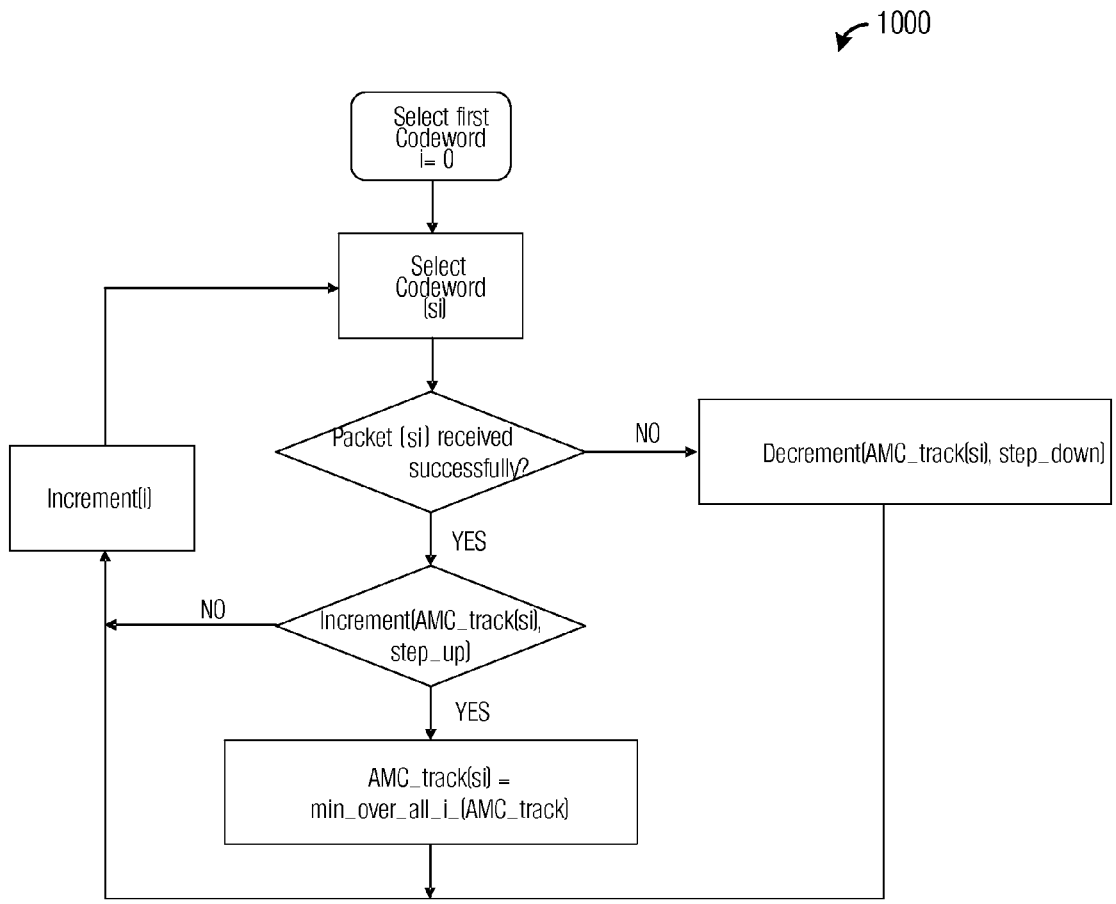
FIG. 10 is a flow diagram of operations in OLLA that selects a minimum target over all codewords.

FIG. 10 illustrates a flow diagram of operations 1000 in OLLA that selects a minimum target over all codewords. Operations 1000 increments the SINR offset whenever a packet is successfully received. However, after incrementing the SINR offset, operations 1000 may reset the SINR offset to a smallest SINR offset value for all layers. If a packet is not successfully received, the SINR offset is decremented.

Operations 1000 may be written in pseudo-code form for independent stream optimization. An exemplary pseudo-code form of operations 1000 for independent stream optimization is presented below:

```
    if (cond1)
        AMC_doppler_track_1 = AMC_doppler_track_1 + track_step;
    elseif (cond3)
        AMC_doppler_track_1 = AMC_doppler_track_1 -
            track_step_down;
    end
    if (cond2)
        AMC_doppler_track_2 = AMC_doppler_track_2 + track_step;
    elseif (cond4)
        AMC_doppler_track_2 = AMC_doppler_track_2 -
            track_step_down;
    end
    AMC_doppler_track_1 = min(AMC_doppler_track_1,
    AMC_doppler_track_2);
    AMC_doppler_track_2 = min(AMC_doppler_track_1,
    AMC_doppler_track_2);
    end.
``` with cond1=(track_flag1 && (track_FER_1>target+fer_calc_error) && FER1); cond2=(track_flag2 && (track_FER_2>target+fer_calc_error) && FER2); cond3= (track_flag1 && (FER1==0)); and cond4=(track_flag2 && (FER2==0)); where track_flag1 and track_flag2 are transmission tracking indicators for layers 1 and 2, track_FER_1 and track_FER_2 are estimated FERs for layers 1 and 2, target is a target FER, track_step is an up-tick step size, track_step_down is a down-time step size, fer_calc_error is an expected error between the estimated FER and an actual FER, and FER1 and FER2 are indicators of an occurrence of an error for layers 1 and 2.

As discussed previously, simple averaging may be used to smooth reported SINRs. An example embodiment is shown below:

```
If (track_throughput_mode ==1)
    Average_throughput = Track_average_throughput_of_system( );
    If (num_frames > X)
        Track_throughput_mode = 0;
    End
Else
    If (Doppler_measure > Doppler_target)
        If (average_throughput >= store_average_throughput)
            Buffer_size_old = buffer_size
            Buffer_size = Buffer_size + 1;
            Store_average_throughput = average_throughtput;
            Track_throughput_mode = 1;
        Elseif (new_average_throughput < store_average_throughput)
            Buffer_size = buffer_size_old
            Store_average_throughput = average_throughtput;
            Track_throughput_mode = 1;
    Elseif (Doppler_measure < Doppler_target)
        If (average_throughput >= store_average_throughput)
            Buffer_size_old = buffer_size
            Buffer_size = Buffer_size - 1;        % minimum is 1;
            Store_average_throughput = average_throughtput;
            Track_throughput_mode = 1;
        Elseif (new_average_throughput < store_average_throughput)
            Buffer_size = buffer_size_old
            Store_average_throughput = average_throughput;
            Track_throughput_mode = 1;
End
```

The above example averages a last X received reported SINRs, where a value of X may be calculated dynamically by tracking a variability of the link. The variability of the link may be estimated by either calculating a Doppler frequency of the link or by calculating a standard deviation of the reported SINRs over a period of time. A number of SINRs used to estimate the variability of the link may be selected from a look-up table generated from channel statistics or by a feedback loop, for example.

Evaluation of mobility based SINR smoothing and SINR offset calculation using OLLA were performed. Table 1 presents wireless communications system parameters utilized in the evaluation.

TABLE 1

| Parameters | |
| --- | --- |
| Carrier frequency | 2.0 GHz |
| System bandwidth | 5 MHz |
| Data transmission BW | 6 RBs (60 subcarriers) |
| Slot format | Normal CP (7 symbols per slot) |
| Channel model | SCM |
| Fading speed | 3 km/h, 30 km/h |
| Antenna configuration | 2 × 2 |
| Tx Antenna correlation | 0 |
| Rx Antenna correlation | 0 |
| Channel coding | Turbo code |
| Modulation | QPSK, 16QAM, 64QAM |
| Receiver | Linear MMSE or MMSE/SIC |
| Channel estimation | Perfect |
| AMC target termination | 10% at $1^{st}$ subpacket |
| CQI feedback delay | 4 ms |
| Precoding codebook | LTE Rel-8 DL precoding codebook |
| Layer blanking during re-transmission | No |

Figure 11:
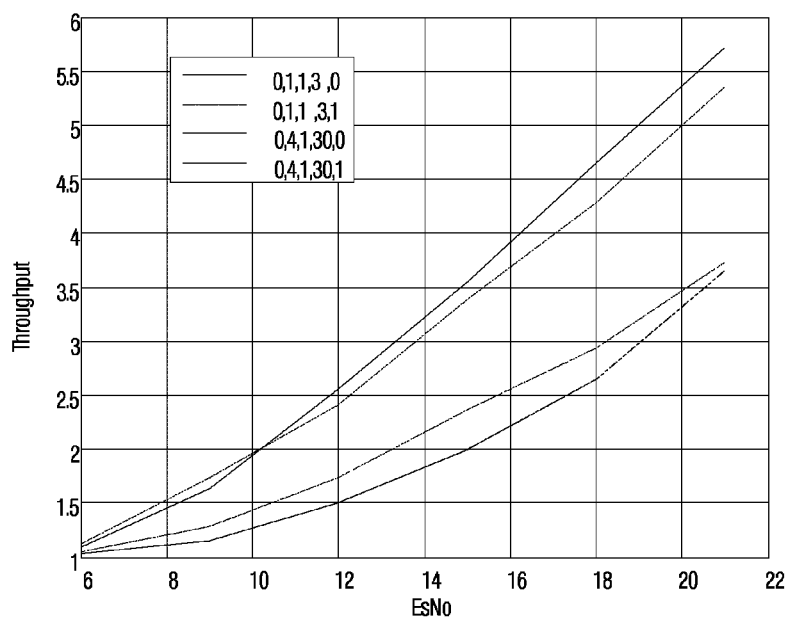
FIGS. 11 and 12 are plots of system throughput versus transmitted symbols and noise spectrum density.
Figure 12:
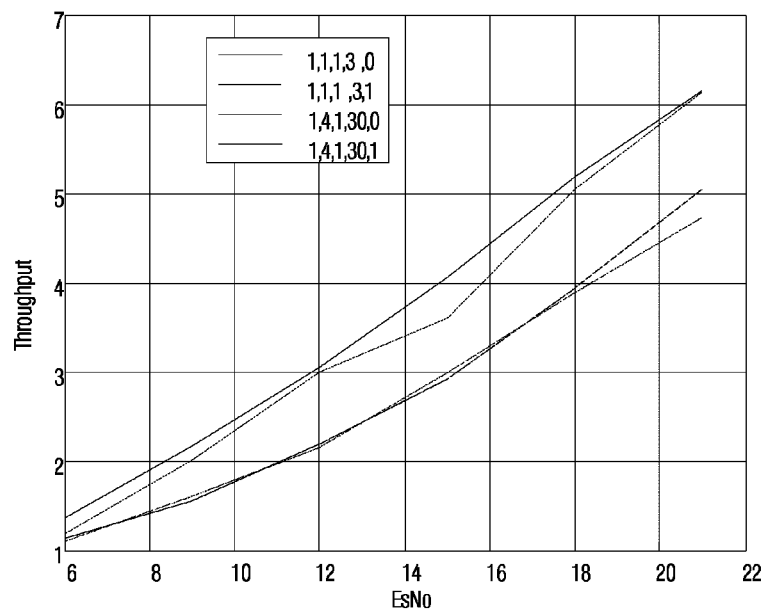

FIGS. 11 and 12 illustrate plots of system throughput versus transmitted symbols and noise spectrum density. As shown in FIGS. 11 and 12, each curve corresponds to up to five numbers (x1, x2, x3, x4, x5) corresponding to: x1—receiver type (0=MMSE, 1=SIC), x2—SINR averaging buffer size (1 or 4), x3—OLLA (0=no, 1=yes), x4—speed (3 or 30 km/hr), and x5—layer shifting/bundling (0=no, 1=yes). Results show that for a mobility of 30 km/hr, an optimal SINR averaging buffer size is four, while for a mobility of 3 km/hr, an optimal SINR averaging buffer size is one.

Figures 13A, 13B:
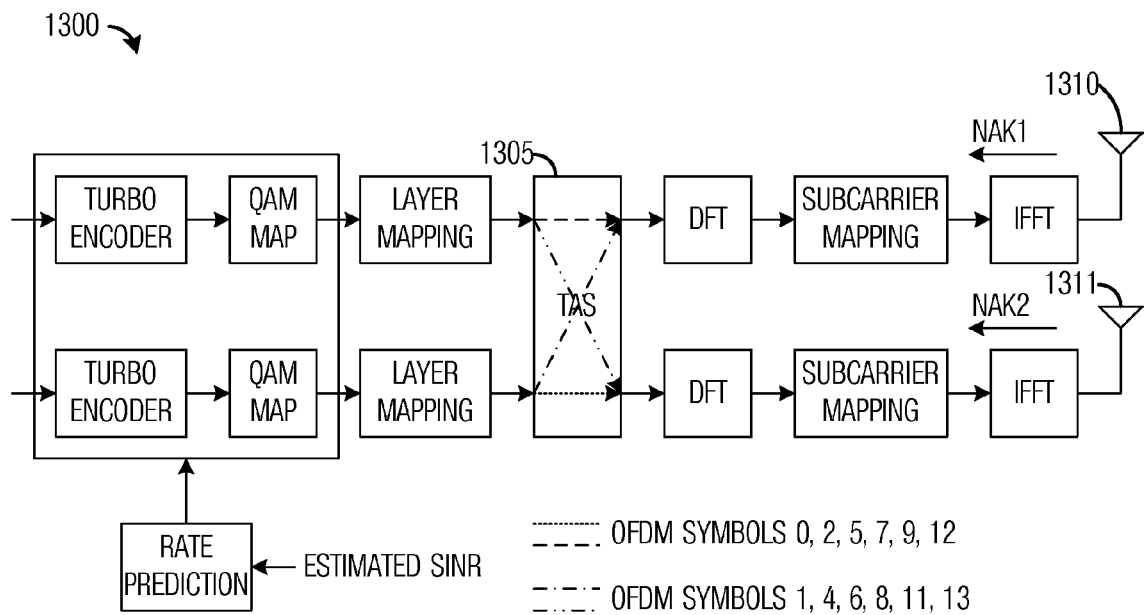
FIG. 13a is a diagram of a first transmitter/receiver system.
FIG. 13b is a diagram of an output of transmitter/receiver system.

FIG. 13a illustrates a first transmitter/receiver system 1300. A two codeword uplink (UL) multiple input, multiple output (MIMO) system is shown in FIG. 13a, with an optional transmit antenna selection (TAS) module 1305. TAS module 1305 may implement layer shifting in which symbols from each layer are transmitted alternately on different physical antennas, such as antennas 1310 and 1311. For example, straight-through dashed and dotted lines in TAS module 1305 indicate SC-FDMA symbols 0, 2, 5, 7, 9, 12, and so forth, while crossing dotted-dashed and double dotted-dashed lines indicate SC-FDMA symbols 1, 4, 6, 8, 11, 13, and so on.

Additionally, NAK bundling may be supported in transmitter/receiver system 1300. Generally, in NAK bundling, a number of ACK/NAK bits may be compressed into a smaller number of ACK/NAK bits. For example, N ACK/NAK bits may be compressed into M ACK/NAK bits, where N>M. The M compressed ACK/NAK bits may then be transmitted in place of the N ACK/NAK bits. When NAK bundling is used, NAK1=NAK2=NAK.

FIG. 13b illustrates an output of transmitter/receiver system 1300. The output may be expressed as:

$$y = Hs + n$$
$$= h_1 s_1 + h_2 s_2 + n,$$

where $y \sim M_R$, $H \sim M_R \times M_T$, $h_i \sim M_R \times 1$, $s \sim M_T \times 1$, $s \sim 1 \times 1$, and $n \sim N(0, N_0)$ with $N_0$ being the number of physical antennas, $M_T$ and $M_R$ being the transmit and receive antenna coefficient matrices, respectively.

Figure 13C:
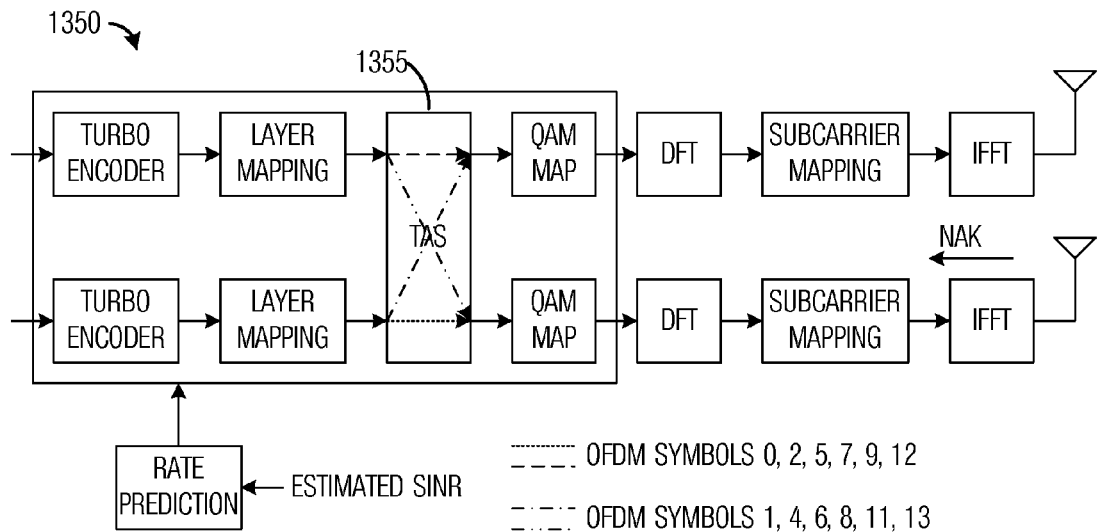
FIG. 13c is a diagram of a second transmitter/receiver system.

FIG. 13c illustrates a second transmitter/receiver system 1350. Transmitter/receiver system 1350 may be similar to transmitter/receiver system 1300 shown in FIG. 13a with exception of TAS module 1355 used to implement layer shifting prior to QAM mapping as opposed to after layer mapping as in transmitter/receiver system 1300. For example, straight-through dashed and dotted lines in TAS modules 1355 indicate SC-FDMA symbols 0, 2, 5, 7, 9, 12, and so forth, while crossing dotted-dashed and double dotted-dashed lines indicate SC-FDMA symbols 1, 4, 6, 8, 11, 13, and so on. Transmitter/receiver system 1350 supports NAK bundling.

Figure 13D:
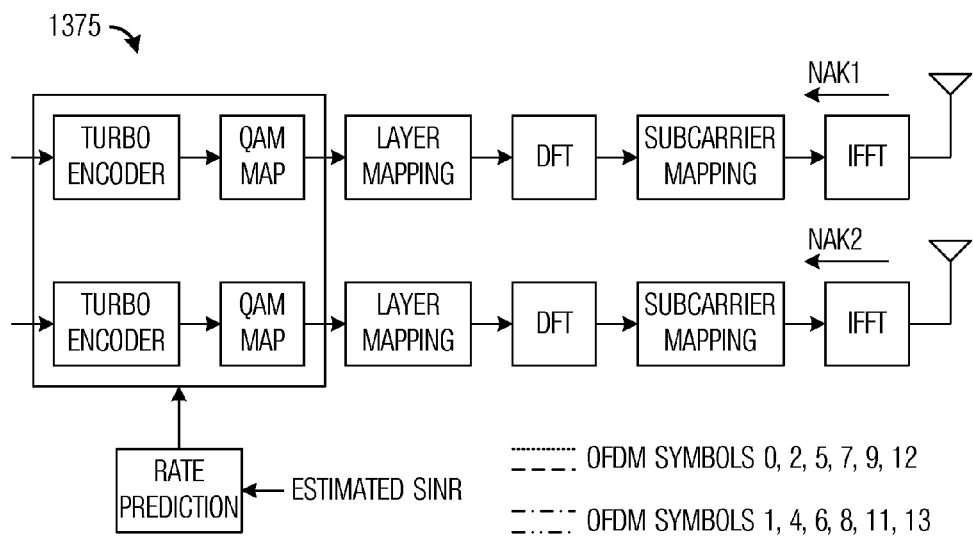
FIG. 13d is a diagram of a third transmitter/receiver system.

FIG. 13d illustrates a third transmitter/receiver system 1375, wherein transmitter/receiver system 1375 performs no layer shifting or NAK bundling.

The layer shifting obeys a formula expressible as:

Physical Layer Index=(Virtual Layer Index+Data SC-FDM Symbol Index)mod L, where L represents the number of the layers for specified UL MIMO transmission schemes. This implies that the shifting occurs on the order of an SC-FDMA symbol. TAS module 1305 may operate with layer shifting or hybrid automatic repeat request (HARQ) bundling. If HARQ bundling is enabled, then NAK1=NAK2=NAK. Thus there may be four possible schemes:
1. UL MIMO with no layer shifting and no bundling;
2. UL MIMO with no layer shifting and bundling;
3. UL MIMO with layer shifting and no bundling; and
4. UL MIMO with layer shifting and bundling.

Figure 14A:
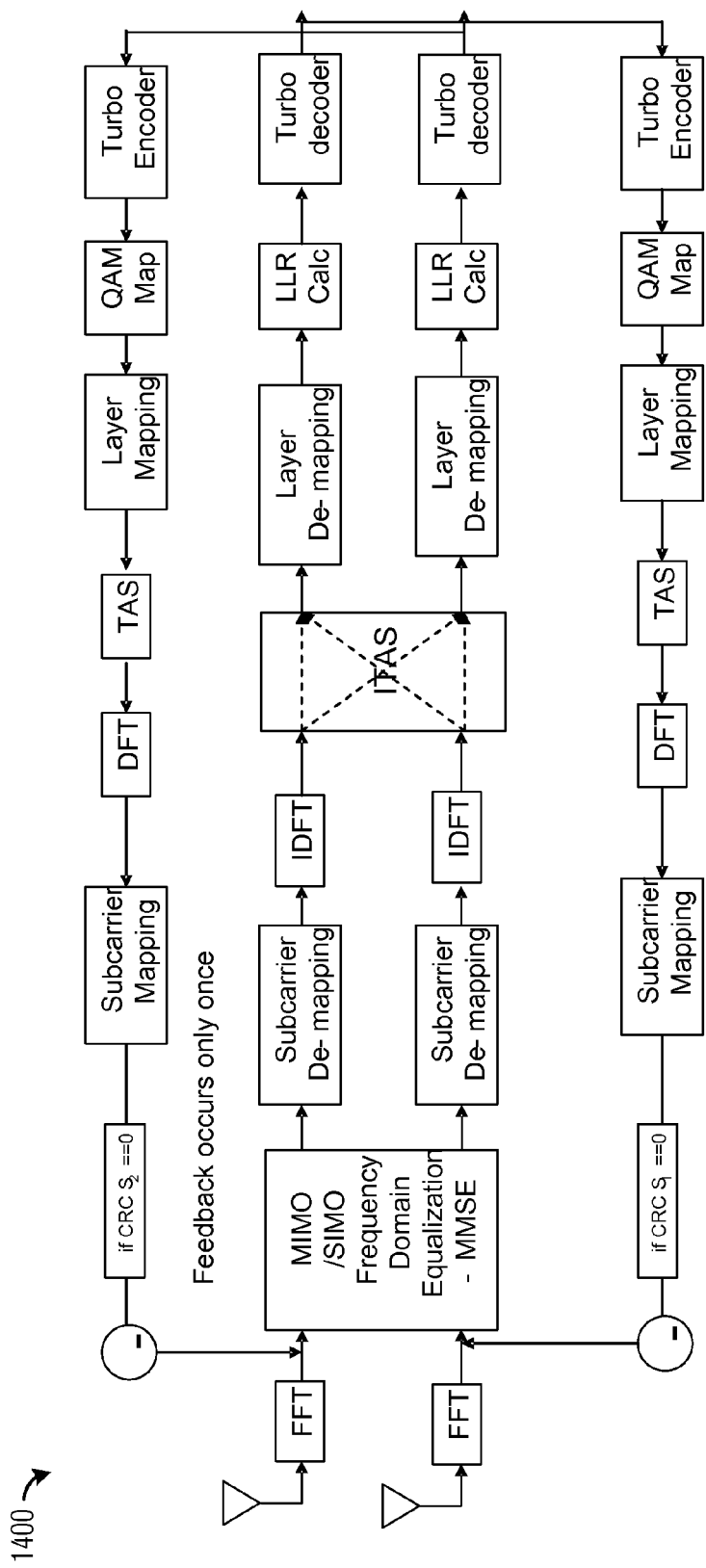
FIG. 14a is a diagram of a successive interference cancellation (SIC) receiver.
Figure 14B:
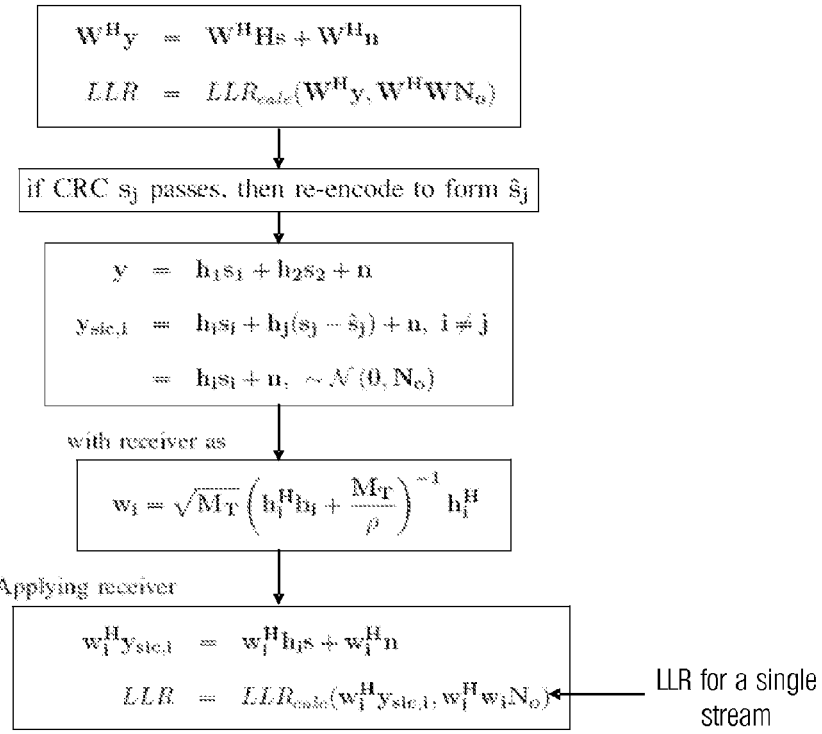
FIG. 14b is a flow diagram of SIC receiver operations.

FIG. 14a illustrates a successive interference cancellation (SIC) receiver 1400 and FIG. 14b illustrates a flow diagram of SIC receiver operations 1450. SIC receiver 1400 decodes both streams (received at its two physical antennas) with a basic minimum mean squared error (MMSE) receiver, for example. If either or both streams are successfully decoded or unsuccessfully decoded, the SIC receiver operation 1450 terminates (FIG. 14b). If the decoding of a first stream succeeds while the decoding of a second stream does not succeed, then the successfully decoded stream (the first stream) may be decoded, re-encoded, and subtracted from the received signal (a combination of both the first stream, the second stream, as well as noise). The resulting signal (the received signal minus the re-encoded first stream may then be passed through a single stream maximum ratio combining (MRC)/MMSE receiver to decode the unsuccessfully decoded stream (the second stream).

Therefore, there is a need to focus on techniques to improve the link adaptation based on both the reported SINR and the reporting of packet errors and re-transmissions in the HARQ process specifically for a SIC receiver.

Figure 15A:
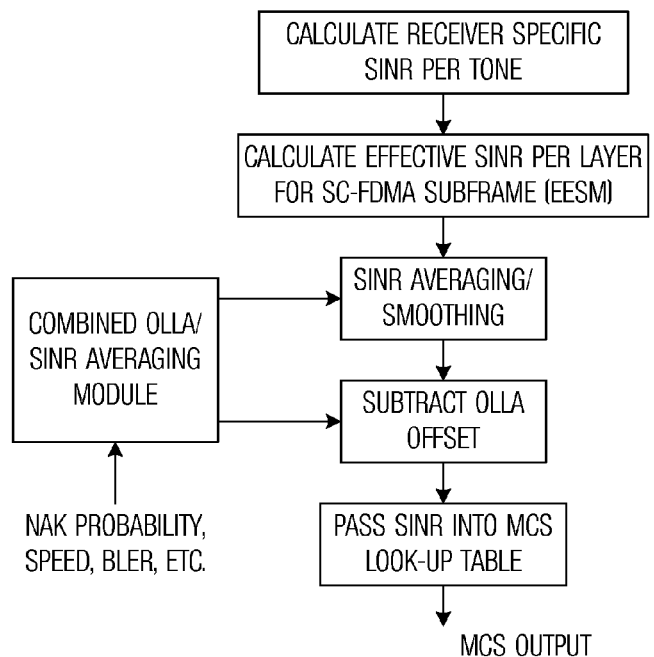
FIG. 15a is a flow diagram of a link adaptation process that makes use of reported SINR as well as packet errors and re-transmissions.

FIG. 15a illustrates a flow diagram of a link adaptation process 1500 that makes use of reported SINR as well as packet errors and re-transmissions. Link adaptation process 1500 includes calculating a receiver specific SINR per tone as well as calculating an effective SINR per layer for SC-FDMA subframe, using exponential effective SIR mapping (EESM), for example.

SINR averaging and/or smoothing may then be performed and an OLLA offset may be subtracted. Subtracting (and/or adding depending on the sign of the OLLA offset) the OLLA offset may be a way to adjust a behavior of the link adaptation based on the SINR reports and the packet errors and re-transmissions. As an example, if the packet errors indicate that a MCS used in link adaptation is too aggressive and producing too many packet errors, then an OLLA offset may be selected to reduce an aggressiveness of the MCS used in link adaptation. Similarly, if the packet errors indicate that a MCS used in link adaptation is too conservative and producing too few packet errors, then an OLLA offset may be selected to increase an aggressiveness of the MCS used in link adaptation.

The OLLA offset may be determined on a variety of factors, including channel quality measurements, as well performance measures, both long term and short term. Examples of channel quality measurements include reported SINR measurements of the channel, self measured SINR measurements based on sounding signals, signal to noise ratio (SNR) measurements (both reported and self-measured), and so forth. Channel quality measurements provide a quantitative measure of channel conditions.

Performance measures provide an indication of achievable performance on the channel, both long term and short term (or instantaneous), using specified communications system parameters. Performance measures may include packet error rate (PER), frame error rate (FER), bit error rate (BER), throughput, acknowledgements indicating successful or unsuccessful reception, and so forth. The performance measures may be based on the channel quality of the channel plus communications system parameters, such as modulation and coding scheme, and so on, which may be specified by an operator of the communications system.

The OLLA offset, in addition to values used in SINR averaging and/or smoothing may be provided by a combined OLLA/SINR averaging module. Combined OLLA/SINR averaging module may provide the OLLA offset and the values used in SINR averaging and/or smoothing based on SINR reports as well as packet errors and re-transmissions (actual values or estimates).

As discussed previously, the SINR calculated and reported by the UE (or calculated by the NB on an uplink) may depend on the capabilities of the UE's (or NB's) receiver. For example, the SINR may be based on a minimum mean squared error (MMSE) interference rejection capability of the receiver. If the receiver has MMSE-successive interference cancelling (SIC) capability, then the receiver may calculate two SINRs, a first using a MMSE suppression technique and a second may assume that a first stream will be cancelled by SIC operation and will use a more optimal maximal ratio combining (MRC) combining technique, thereby, generally producing a higher SINR value than the SINR produced using MMSE. The receiver may then need to decide which SINR combination to choose. For example, option 1: MMSE SINR layer 1+SIC SINR layer 2 or option 2: SINR layer 1+MMSE SINR layer 2.

The SINR calculations may be computed on a per tone basis, and then combined across a subband including multiple tones using a EESM method, for example. According to an alternative embodiment, simple averaging per tone or averaging mutual information per tone may be performed.

A filter or a moving average may be used to smooth out the effect of SINR variations that may be present in time or over different measurements. SINR variation may be particularly significant in situations with a rapidly moving UE.

An adjusted SINR value may then be passed to a MCS look-up table (or an MSC selection function) to select a MCS for the link. An MCS may be selected, wherein the MCS selected may be a MCS that maximizes a throughput given the adjusted SINR. The MCS may be selected in a traditional way from block error rate (BLER) curves or alternatively, the MCS may be selected from throughput curves, such as shown in FIG. 6a with a 10 percent cutoff and FIG. 6b with a 1 percent cutoff. MCS table generation may be based on results from a simulation or from throughput curves of cut-off MCS levels at desired block error rate (BLER) targets. The MCS table may almost be monotonic, i.e., 4 QAM, 16 QAM, 64 QAM, etc.

Table 2 illustrates an exemplary MCS table.

TABLE 2

MCS table.

| MCS | Rate |
| --- | --- |
| 4.0000 | 0.3333 |
| 4.0000 | 0.5000 |
| 4.0000 | 0.6000 |
| 4.0000 | 0.6667 |
| 4.0000 | 0.7500 |
| 4.0000 | 0.8333 |
| 16.0000 | 0.3333 |
| 16.0000 | 0.5000 |
| 16.0000 | 0.6000 |
| 16.0000 | 0.6667 |
| 16.0000 | 0.7500 |
| 16.0000 | 0.8333 |
| 64.0000 | 0.5000 |
| 64.0000 | 0.6667 |
| 64.0000 | 0.7500 |
| 64.0000 | 0.8000 |

FIG. 15b illustrates a flow diagram of communications device operations 1550 in transmitting information, wherein the transmission is encoded using a link adaptation process as shown in FIG. 15a. Communications device operations 1550 may be indicative of operations occurring in a communications device, such as a NB of a communications system, as the communications device transmits information to a mobile device served by the communications device. Communications device operations 1550 may also be indicative of operations occurring in a communications device, such as a mobile device of a communications system, as the communications device transmits information to a NB serving the communications device.

Communications device operations 1550 may begin with the communications device receiving information, in the form of codewords, to transmit (block 1555). The information may be generated by the communications device itself, a user of the communications device, an information source coupled to the communications device, or so on.

The communications device may then encode the information, wherein the encoding may include operations such as turbo encoding, QAM mapping, layer mapping, layer shifting, and so forth (block 1560). The encoding of the information may be based on a measurement of a channel being used to transmit the information, such as a measured SINR from the communications device or from a recipient of the transmission.

The encoding of the information may also make use of rate prediction information computed based on long term and short term quality measures, such as estimated error information, detected errors, and so forth, related to the channel. Examples of the long term and short term quality measures used in rate prediction may include a measured error rate at specified events over time, an estimated error rate, an estimation error, HARQ ACK/NAKs, and so forth. The rate prediction information generated from the estimated information may make use of HARQ ACK/NAKs that are bundled using NAK bundling. The rate prediction information may be used to select a MCS used in encoding the information, for example.

The encoded information may then be transmitted (block 1565). Transmitting the encoded information may include processing of the encoded information, such as domain converting, parallel to serial converting, subcarrier mapping, amplifying, filtering, and so forth, for example. Communications device operations 1550 may then terminate.

FIG. 16 illustrates a pseudo-code description of a buffer size adaptation algorithm.

As described herein, the embodiments focus on optimizing OLLA for a SC-FDMA SIC receiver. The SC-FDMA operates in a wireless communications system wherein there are multiple transmitted codeblocks (also referred to as a multi code word (MCW) system). There may be two cases: a first case where layer shifting is applied and a second case where layer shifting is not applied.

An optimized OLLA for a MMSE receiver that operated only on ACK/NAK signals was previously presented. In addition to the ACK/NAK signals, it may be possible to utilize statistics (such as statistics of a packet error rate), namely an actual probability of packet error (prob(packet error)) rather than a probability of a NAK (prob(NAK)) as used previously. Since this for the UL, both probabilities are available at the NB's receiver. Finer control may be obtained when prob (packet error) is used.

Optimal performance may be achieved by:
Independently increasing the offset
if either stream has a NAK and its individual prob(packet error) exceeds a threshold; and
setting thresholds independently for each stream.
Jointly reducing offset (OR)
if either stream has an ACK (occurs due to bundling).

Figure 17:
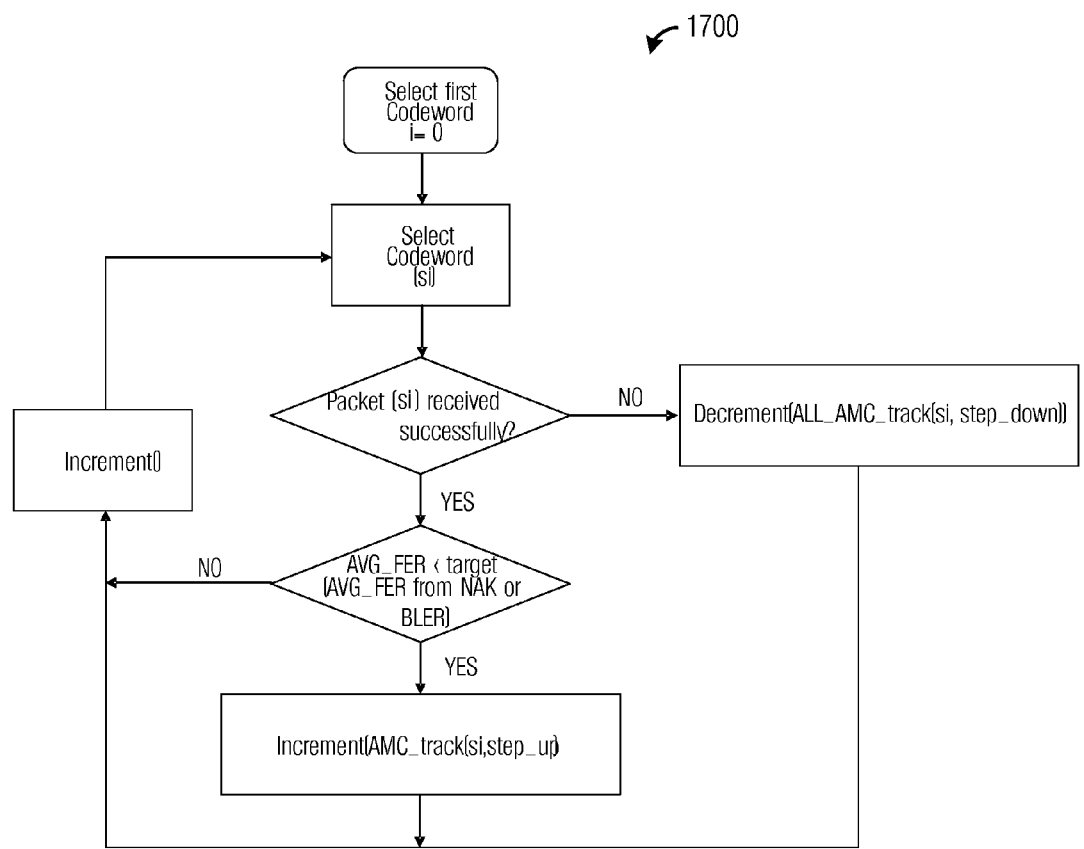
FIG. 17 is a flow diagram of operations for OLLA in a MMSE-SIC receiver with layer shifting.

FIG. 17 illustrates a flow diagram of operations 1700 for OLLA in a MMSE-SIC receiver with layer shifting. Operations 1700 may operate only on first transmitted packet statistics and does not consider retransmission packets. Operations 1700 may be described in pseudo-code as follows:

if (prob(packet error) for stream one is greater than target rate plus error margin) and NAK1 is received then decrement AMC offset for stream 1 by downtick step size; {Become less aggressive} if (prob(packet error) for stream two is greater than target rate plus error margin) and NAK2 received then decrement AMC offset for stream 2 based on stream 1 by downtick step size; {Become less aggressive} if (ACK1 received and ACK2 received) then increment AMC offset for stream 1 and AMC offset for stream 2 by uptick step size. {Become more aggressive}

In high-level form, operations 1700 for independent OLLA optimization per stream with NAK bundling may be written in pseudo-code form as:

```
if ((event1) && (LTPM1 met) && (STPM1 met))
    select more aggressive MCS1
elseif ((event1) && (STPM1 met))
    select less aggressive MCS1
end
if ((event2) && (LTPM2 met) && (STPM2 met))
    select more aggressive MCS2
elseif ((event2) && (STPM2 met))
    select less aggressive MCS2
end.
``` where event1 and event2 are indicators of an occurrence of an event corresponding to a long term performance measure for streams 1 and 2, such as a first packet of a sequence of packets is being transmitted, LTPM1 and LTPM2 are long term performance measure conditions for streams 1 and 2, such as a 10% FER for first packets of each sequence of packets, and STPM1 and STPM2 are short term performance measure for streams 1 and 2, such as an occurrence of an error.

A pseudo-code description of operations 1700 for independent OLLA optimization per stream with NAK bundling may be seen below:

```
if (cond1)
    AMC_doppler_track_1 = AMC_doppler_track_1 + track_step;
elseif (cond3)
    AMC_doppler_track_1 = AMC_doppler_track_1 −
    track_step_down;
end
if (cond2)
    AMC_doppler_track_2 = AMC_doppler_track_2 + track_step;
elseif (cond4)
    AMC_doppler_track_2 = AMC_doppler_track_2 −
    track_step_down;
end.
``` with cond1=(track_flag1 && (track_FER_1>target+fer_calc_error) && NAK1); cond2=(track_flag2 && (track_FER_2>target+fer_calc_error) && NAK2); cond3= (track_flag1 && NAK1); and cond4=(track_flag2 && NAK2);

where track_flag1 and track_flag2 are transmission tracking indicators for layers 1 and 2, track_FER_1 and track_FER_2 are desired FERs for layers 1 and 2, target is an estimated FER, track_step is an up-tick step size, track_step_down is a down-time step size, fer_calc_error is an estimation error in the estimated FER, and NAK1 and NAK2 are NAK rates for layers 1 and 2.

Referencing the pseudo-code form of operations 1700 for independent OLLA optimization per stream with NAK bundling presented above, track_flag1 and track_flag2 may be examples of event1 and event2, (track_FER_1>target+fer_calc_error) and (track_FER_2>target+fer_calc_error) && FER2) may be examples of LTPM1 and LTPM2, and NAK1 and NAK2 may be examples of STPM1 and STPM2.

A pseudo-code description of operations 1700 for joint OLLA optimization per stream with layer shifting and NAK bundling for MMSE receivers may be seen below:

```
if (cond1 && cond2)
    AMC_doppler_track_1 = AMC_doppler_track_1 + track_step;
    AMC_doppler_track_2 = AMC_doppler_track_2 + track_step;
elseif (cond3 || cond4)
    AMC_doppler_track_1 = AMC_doppler_track_1 −
    track_step_down;
    AMC_doppler_track_2 = AMC_doppler_track_2 −
    track_step_down;
End.
``` with cond1=(track_flag1 && (track_FER_1>target+fer_calc_error) && NAK1); cond2=(track_flag2 && (track_FER_2>target+fer_calc_error) && NAK2); cond3= (track_flag1 && NAK1); and cond4=(track_flag2 && NAK2);

where track_flag1 and track_flag2 are transmission tracking indicators for layers 1 and 2, track_FER_1 and track_FER_2 are desired FERs for layers 1 and 2, target is an estimated FER, track_step is an up-tick step size, track_step_down is a down-time step size, fer_calc_error is an estimation error in the estimated FER, and NAK1 and NAK2 are NAK rates for layers 1 and 2.

A pseudo-code description of operations 1700 for semi-independent OLLA optimization per stream with layer shifting and NAK bundling for SIC receivers may be seen below:

```
if (cond1) [less aggressive]
    AMC_doppler_track_1 = AMC_doppler_track_1 + track_step;
end
if (cond2)
    AMC_doppler_track_2 = AMC_doppler_track_2 + track_step;
end
if (cond3 && cond4) [more aggressive]
    AMC_doppler_track_1 = AMC_doppler_track_1 -
        track_step_down;
    AMC_doppler_track_2 = AMC_doppler_track_2 -
        track_step_down;
End.
``` with cond1=(track_flag1 && (track_FER_1>target+fer_calc_error) && NAK1); cond2=(track_flag2 && (track_FER_2>target+fer_calc_error) && NAK2); cond3=(track_flag1 && NAK1); and cond4=(track_flag2 && NAK2);
where track_flag1 and track_flag2 are transmission tracking indicators for layers 1 and 2, track_FER_1 and track_FER_2 are desired FERs for layers 1 and 2, target is an estimated FER, track_step is an up-tick step size, track_step_down is a down-time step size, fer_calc_error is an estimation error in the estimated FER, and NAK1 and NAK2 are NAK rates for layers 1 and 2.

A property of a SIC receiver is that the throughput is maximized if the decoding order is optimized. Given that at the SIC receiver, a layer calculates an offset based on the MRC receiver at time t and then calculates an offset based on a MMSE receiver at time t+1. The offset may then be used to select a modulation and coding scheme to decode the received transmission. Several different methods may be used to resolve issue.

Method 1: use an OLLA process for each layer. This works if the channel changes slowly, giving adequate time for convergence.

Method 2: use a separate OLLA process for each decoding order. The SIC receiver measures the effective channels (or throughputs) and chooses a corresponding OLLA process. OLLA process 1: step_up (MMSE1, MRC2), step_down (MMSE1, MRC2). OLLA process 2: step_up (MRC1, MMSE2), step_down (MRC1, MMSE2). The OLLA process chosen may be based on which order is selected by the NB.

Method 3: use one process order. Process 1: step_up (MMSE1, MRC2), step_down (MMSE1, MRC2). Process 2: use the offsets generated by Process 1.

Figure 18:
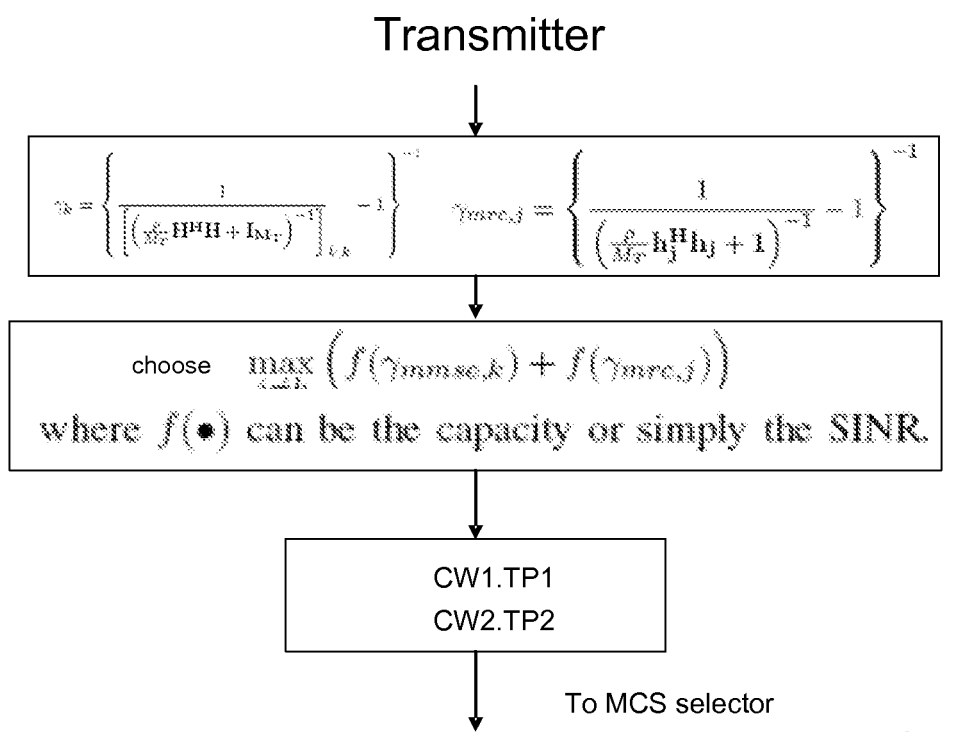
FIG. 18 is a flow diagram of operations in order selection at a transmitter.

FIG. 18 illustrates a flow diagram of operations 1800 in order selection at a transmitter. At the transmitter, the layer with the higher capacity is selected first, followed by the layer with the lower capacity.

Figure 19:
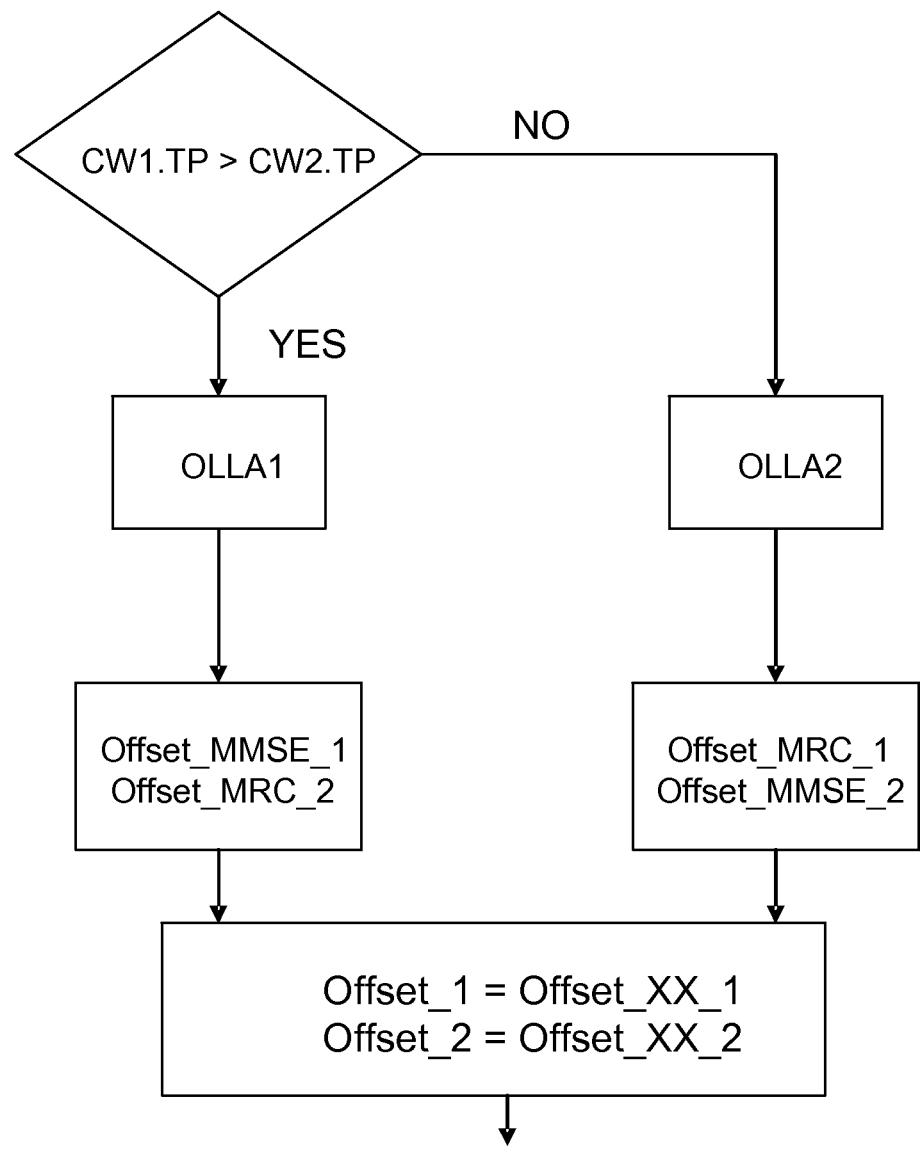
FIG. 19 is a flow diagram of first transmitter operations for determining offsets for OLLA receiving with a SIC receiver.

FIG. 19 illustrates a flow diagram of first transmitter operations 1900 for determining offsets for OLLA receiving with a SIC receiver according to Method 1 described above. As shown in FIG. 19, different OLLA processes may be used for different possible orderings of the layers. For example, each layer is processed using a separate OLLA process with a MMSE receiver used for a different layer. After the OLLA processes complete, the results from the OLLA processes are used to select which offsets (and OLLA process) to use. After the offsets are computed, they may be used to select MCS, which may be used to encode information for transmission.

According to an embodiment of first transmitter operations 1900, two different OLLA processes computing different offsets based on one of two different layer orderings and then the offsets may be selected based on an actual ordering of the layers.

According to an alternative embodiment of first transmitter operations 1900, an actual ordering of the layers may be determined and then based on the actual ordering of the layers, one of two OLLA processes may be used to compute the offsets.

Figure 20:
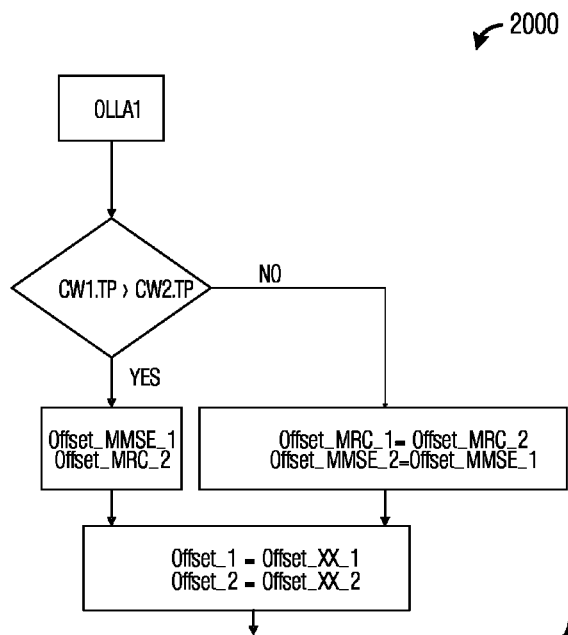
FIG. 20 is a flow diagram of second transmitter operations for determining offsets for OLLA receiving with a SIC receiver.

FIG. 20 illustrates a flow diagram of second transmitter operations 2000 for determining offsets for OLLA receiving with a SIC receiver according to Method 2 described above. As shown in FIG. 20, a single OLLA process processes the layers according to an assumed layer ordering (yielding a particular processing order) and then based on an actual ordering of the layers, the offsets may be switched if the assumed layer ordering is different from the actual ordering. After the offsets are computed, they may be used to select MCS, which may be used to encode information for transmission.

As shown in FIGS. 19 and 20, the determining of the offsets for OLLA receiving may be based on an ordering of the layers. With FIG. 19, the ordering of the layers have a role in the selection of both the OLLA processing as well as the offset determination, while with FIG. 20, the ordering of the layers play a role only in the offset determination. In first transmitter operations 1900, the ordering of the layers may be used to select both the OLLA process used to determine the offsets as well as the computing of the offsets (which offset to compute first, for example). However, in second transmitter operations 2000, the ordering of the layers is only used to compute the offsets.

Figure 21A:
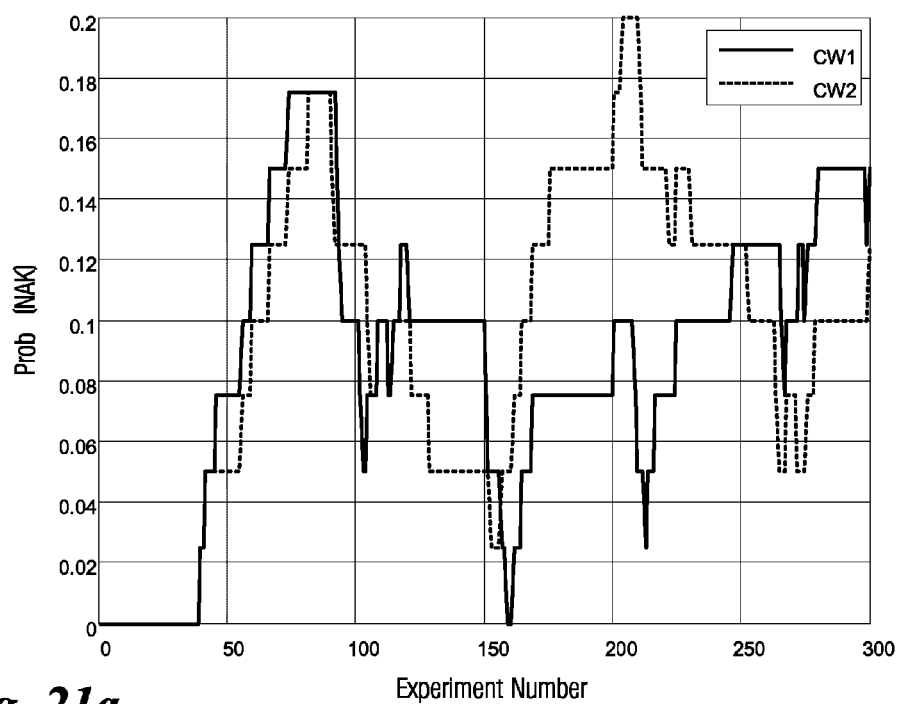
FIGS. 21a and 21b are plots of statistics of a probability of a NAK (prob(NAK)) and SINR offset.
Figure 21B:
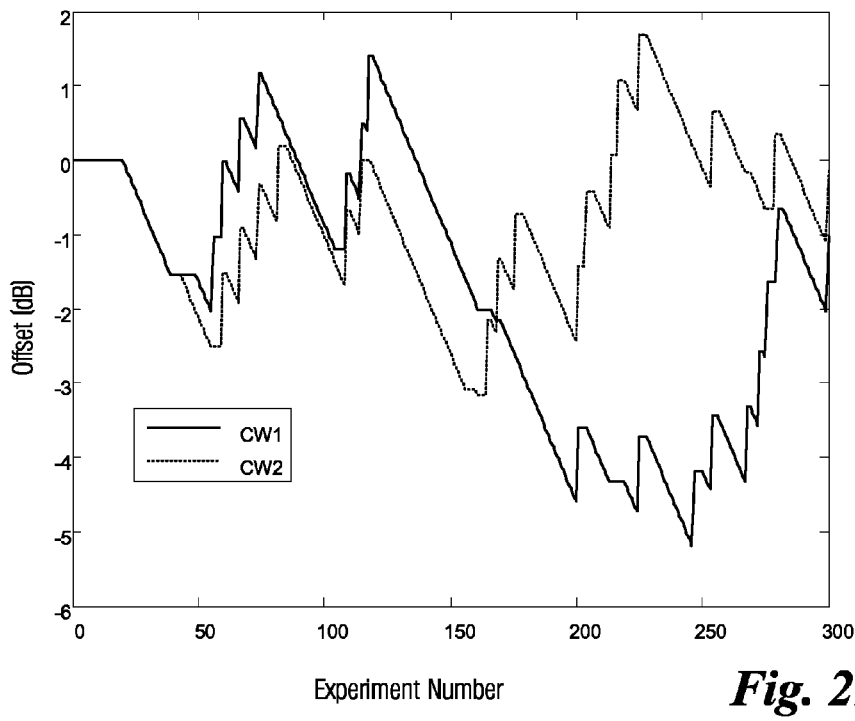

FIGS. 21*a* and 21*b* illustrate plots of statistics of a probability of a NAK (prob(NAK)) and SINR offset. As shown in FIGS. 21*a* and 21*b*, an average probability of a NAK is as expected. However, a variance in the probability of a NAK may be large, ranging from about 0 to 0.18. To help reduce the variance in the probability of a NAK and improve the convergence of the OLLA algorithms, the step size may be adjusted as a function of an absolute distance between the estimate and target PER. For example, the step size may be adjusted as f{|Actual−Target|}.

An alternative embodiment allows for changing the step size in discrete values. Increased aggressiveness may be implemented as a change in the MCS level one level up while decreased aggressiveness may be implemented as a change in the MCS level one level down. To account for different step sizes, a change may occur only after a fixed number of requests for more aggressive MCS selection is received.

Simple averaging SINR smoothing involves the averaging of a specified number of received SINR values. The specified number of received SINR values being averaged being dynamically calculated and may be based on a variability of the channel, for example. The variability of the channel may be estimated by either calculating the Doppler frequency of the channel or by calculating the standard deviation of the received SINR over a period of time. The number of SINRs used is selected from a look-up table generated by studying the statistics of the channel or by a feedback loop, for example.

In general it is preferred to use the average of the reported or measured CQI for link adaptation. One example averaging the CQI is to use a low pass IIR filter with a single time constant ($\rho$). Typical values of $\rho$ could be between 0.1 to 0.01 to ensure a reasonable compromise between smoothing effect and quick response to changing channels. The time constant $\rho$ can be varied depending on UE speed and preferred aggressiveness of the link adaptation technique. An advantage of this technique is that only one average value needs to be stored at any time. The average value (AVG) may be calculated as follows from the instantaneous measured/reported SINR:

$$AVG=\rho*AVG+(1-\rho)*SINR.$$

It is also possible to calculate other second order statistics for the SINR, namely the variance (VAR) which can be calculated similar to the AVG:

$$VAR=\rho*(VAR)+(1-\rho)*(AVG-SINR)^2.$$

The link adaptation algorithm can then use the following metric to determine the MCS $$MCS=f\{AVG-sqrt(VAR)\}.$$

A more stable MCS selection method may be a result and it may automatically adapt the link adaptation aggressiveness according to the variance of the channel. For a slowly varying channel, the variance will be small and the link adaptation MCS will only be a function of the AVG channel which will be very similar to the SINR and therefore be very aggressive. However, when the channel varies quickly, the VAR value will increase and the link adaptation MCS will backoff by the square root of VAR from the average value, which will result in a more conservative MCS estimation.

A UE may also be able to blindly determine its MCS level based on received ACK/NAKs. Given that the MCS level may be a multi-bit field (e.g., 5 bits) in a scheduling message, significant downlink (DL) control overhead may be required. Considering that the NB typically calculates the MCS level based on a known formula, the UE may also perform the calculation to avoid the signaling of the MCS level. The UE calculation of the MCS level may be as follows:

1. UE calculates an effective base SINR from an originally assigned MCS level, expressible as:

$$SINRbase=f(\text{previous scheduled MCS}).$$

2. UE takes the following actions depending on if an ACK or NAK was received:
 if (ACK received) SINRbase=SINRbase+step up;
 if (NAK received) SINRbase=SINRbase−step down.
3. UE determines new MCS level by using inverse function previously used, $$MCSnew=f^{-1}(SINR).$$

The UE is required to know the step up and step down values used by the NB. Therefore, the NB has to inform the UE of these values using a DL control channel message.

Evaluations of the performance of the embodiments disclosed herein are provided below. Specifically, the following techniques were evaluated:
 Optimized OLLA for SIC with Layer Shifting and Bundling
 Optimized OLLA for SIC without Layer Shifting and Bundling
 Adaptive Step Size for Improved Convergence.
Table 3 provides a detailed list of system parameters.

TABLE 3

| System Parameters | |
| --- | --- |
| Carrier frequency | 2.0 GHz |
| System bandwidth | 5 MHz |
| Data transmission BW | 6 RBs (60 subcarriers) |
| Slot format | Normal CP (7 symbols per slot) |
| Channel model | SCM |
| Fading speed | 3 km/h, 30 km/h |
| Antenna configuration | 2 × 2 |
| Tx Antenna correlation | 0 |
| Rx Antenna correlation | 0 |
| Channel coding | Turbo code |
| Modulation | QPSK, 16QAM, 64QAM |
| Receiver | Linear MMSE or MMSE/SIC |
| Channel estimation | Perfect |
| AMC target termination | 10% at $1^{st}$ subpacket |
| CQI feedback delay | 4 ms |
| Precoding codebook | LTE Rel-8 DL precoding codebook |
| Layer blanking during re-transmission | No |

Figure 22:
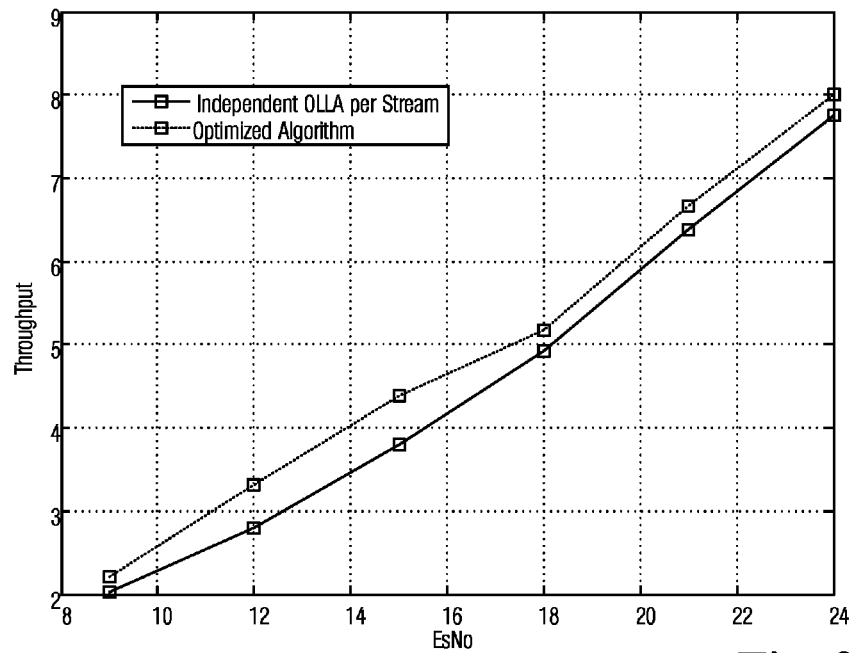
FIG. 22 is a plot of throughput results for optimized OLLA for a SIC receiver with layer shifting and bundling.
Figure 23:
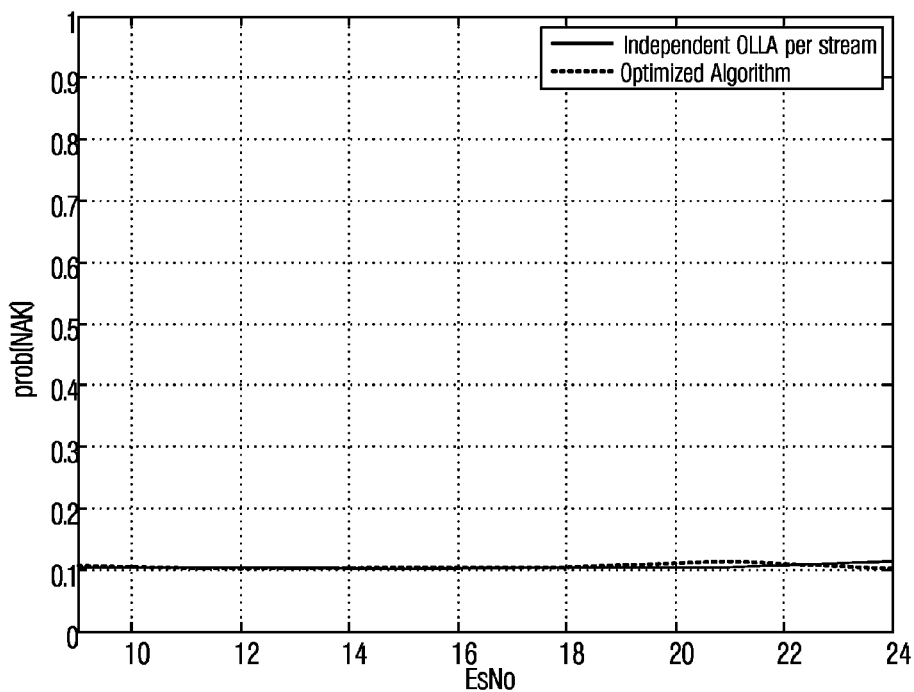
FIG. 23 is a plot of corresponding prob(NAK)

FIG. 22 illustrates a plot of throughput results for optimized OLLA for a SIC receiver with layer shifting and bundling and FIG. 23 illustrates a plot of corresponding prob (NAK). As shown in FIGS. 22 and 23, the embodiments exhibit improvements over independent optimization per stream.

Figure 24:
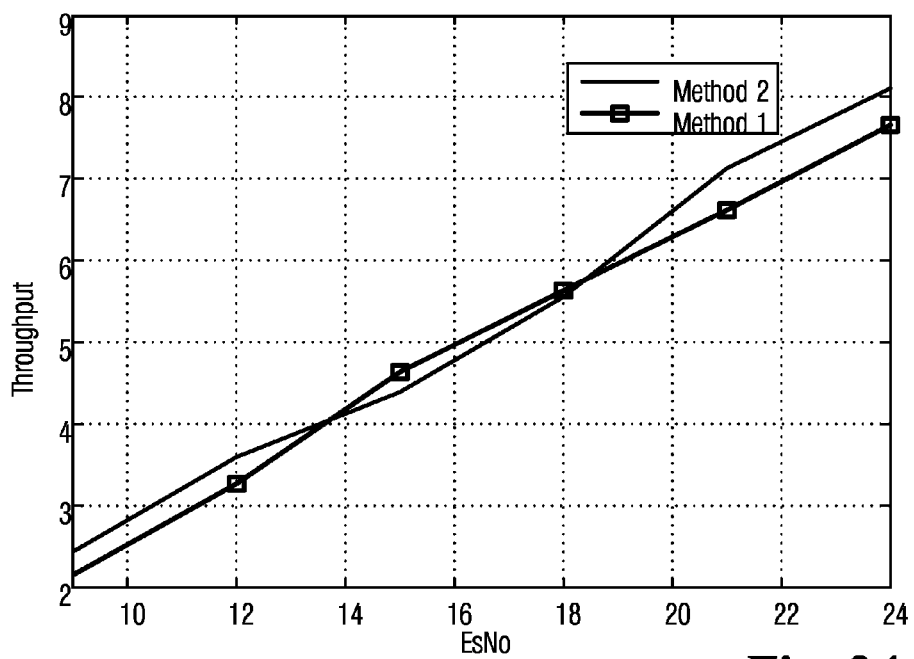
FIG. 24 is a plot of throughput results for optimized OLLA for a SIC receiver without layer shifting and bundling.
Figure 25:
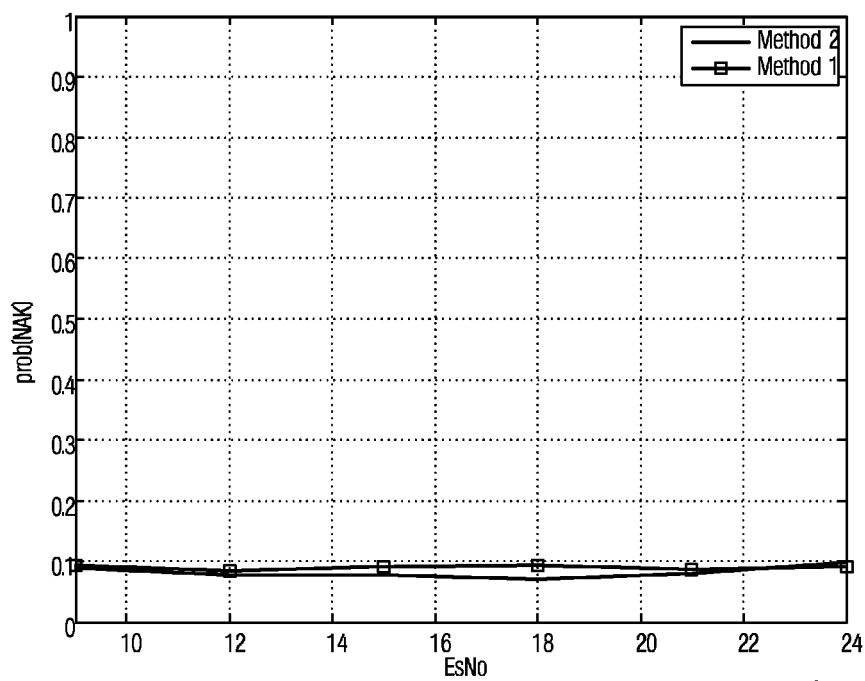
FIG. 25 is a plot of corresponding prob(NAK)

FIG. 24 illustrates a plot of throughput results for optimized OLLA for a SIC receiver without layer shifting and bundling and FIG. 25 illustrates a plot of corresponding prob (NAK). As shown in FIGS. 24 and 25, Method 2 shows improvement over Method 1. However, with a rapidly changing channel, Method 1 will show improvements over Method 2.

Figure 26:
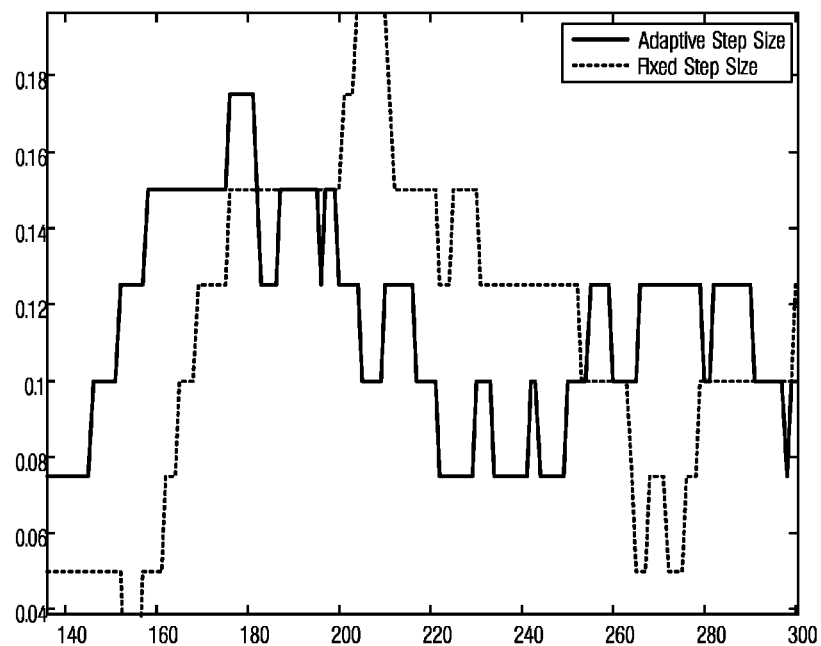
FIG. 26 is a plot of the impact of adaptive step sizes on convergence.

FIG. 26 illustrates a plot of the impact of adaptive step sizes on convergence. The adaptive step size was computed using formula expressible as:

$$\text{step size}=abs(\text{target}-\text{estimated PER})/\text{target}*\text{fixed step size}.$$

As shown in FIG. 26, the variance of PER is reduced when adaptive step sizes was used.

The discussion describes embodiments with advantages and novel features. For example, an embodiment method can be used of OLLA for a SIC receiver with and without layer shifting and bundling as well as MCS ordering. Additionally, adaptive step sizes may be used to improve convergence. Furthermore, discrete step sizes related to a MCS table may be used.

Another embodiment method may be used to improve SINR smoothening. The embodiment method may make use of average of channel quality indicators to implement SINR smoothening. The average of channel quality indicators may be expressed as AVG=$\rho$*AVG+(1−$\rho$)*SINR. Alternatively, a variance of channel quality indicators may be used to implement SINR smoothening. The variance of channel quality indicators may be expressed as VAR=$\rho$*(VAR)+(1−$\rho$)*(AVG−SINR)$^2$. A MCS level may be computed using a function of AVG−sqrt(VAR).

Another embodiment may reduce DL control channel overhead by performing blind MCS estimation at UEs. A base SINR may be computed from an initial MCS level. The SINR may then be increased or decreased based on received ACKs and NAKs and the MCS may be computed using an inverse of a function used to compute the base SINR.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines,

What is claimed is:

1. A method for communications, the method comprising:
receiving information to be transmitted, the information comprising at least one codeword;
encoding the at least one codeword, wherein the encoding is in accordance with a measurement of a channel being used to transmit the information and performance measurements for the channel, wherein the performance measurements include long term performance measurements and short term performance measurements; and
transmitting the encoded at least one codeword.

2. The method of claim 1, wherein the performance measurements further include estimated error information including an estimated error rate for the channel, a target error rate for the channel, an estimation error adjustment for the channel, a probability of an error occurring on a transmission, or a combination thereof.

3. The method of claim 2, wherein the encoding the at least one codeword is further in accordance with a success or failure in decoding a previously transmitted encoded codeword.

4. The method of claim 2, wherein encoding the at least one codeword comprises applying a modulation and coding scheme to the at least one codeword.

5. The method of claim 4, wherein the modulation and coding scheme is selected in accordance with an offset computed from the estimated error information and the performance measurements.

6. The method of claim 5, wherein computing the offset comprises:
when an event has occurred, a long term performance measure is met, and a short term performance measure is met, then selecting the offset so that the selected modulation and coding scheme is more aggressive; or
when the event has occurred and the short term performance measure is not met, then selecting the offset so that the selected modulation and coding scheme is less aggressive.

7. The method of claim 6, wherein the event corresponds to an occurrence of a measurement of the long term performance measure, wherein the long term performance measure is the target error rate>the estimated error rate, and wherein the short term performance measure is a previously transmitted encoded codeword was not decoded successfully.

8. The method of claim 7, wherein the estimated error rate includes the estimation error adjustment.

9. The method of claim 6, wherein selecting the offset so that the selected modulation and coding scheme is more aggressive comprises increasing the offset, and wherein selecting the offset so that the selected modulation and coding scheme is less aggressive comprises decreasing the offset.

10. The method of claim 9, wherein the offset is increased by a first amount, wherein the offset is decreased by a second amount, and wherein the first amount is not equal to the second amount.

11. The method of claim 10, wherein the first amount and the second amount are adjusted dynamically in accordance with a difference between the estimated error rate and the target error rate.

12. The method of claim 6, wherein the at least one codeword is mapped to two layers, and wherein computing the offset comprises:
when:
a first event for a first layer has occurred, a first long term performance measure for the first layer is met, and a first short term performance measure for the first layer is met; and
a second event for a second layer has occurred, a second long term performance measure for the second layer is met, and a second short term performance measure for the second layer is met, then
selecting a first offset so that the selected modulation and coding scheme for the first layer is more aggressive and selecting a second offset so that the selected modulation and coding scheme for the second layer is more aggressive; or
when:
the first event for the first layer has occurred and the first short term performance measure for the first layer is not met;
and the second event for the second layer has occurred and the second short term performance measure for the second layer is not met, then
selecting the first offset so that the selected modulation and coding scheme for the first layer is less aggressive and selecting the second offset so that the selected modulation and coding scheme for the second layer is less aggressive.

13. The method of claim 12, wherein computing the offset further comprises setting the offset to a smaller of the first offset and the second offset.

14. The method of claim 1, wherein the measurement of the channel is a signal plus interference to noise ratio, and wherein the measurement of the channel is averaged over a number of measurements of the channel.

15. The method of claim 14, wherein the measurement of the channel is further smoothed with a smoothing factor.

16. A method for communications, the method comprising:
receiving information to be transmitted, the information comprising at least one codeword;
encoding the at least one codeword for transmission over two layers, wherein the encoding is in accordance with a measurement of a channel being used to transmit the information and estimated error information for the channel, wherein the encoding includes layer shifting and acknowledgement bundling, and wherein the estimated error information is in accordance with long term performance measures and short term performance measures; and
transmitting the encoded at least one codeword.

17. The method of claim 16, wherein the estimated error information includes an estimated error rate for the channel, a target error rate for the channel, an estimation error adjustment for the channel, a probability of an unsuccessful decoding of an encoded transmission, or a combination thereof.

18. The method of claim 17, wherein encoding the at least one codeword comprises applying a modulation and coding scheme to the at least one codeword, and wherein the modulation and coding scheme is selected in accordance with an offset computed from the estimated error information and the measurement.

19. The method of claim 18, wherein computing the offset comprises:
when a first event for a first layer has occurred, a first long term performance measure for the first layer is met, and a first short term performance measure for the first layer is met, then selecting a first offset for the first layer so that the selected modulation and coding scheme for the first layer is more aggressive;

when the first event for the first layer has occurred and the first short term performance measure for the first layer is not met, then selecting the first offset for the first layer so that the selected modulation and coding scheme for the first layer is less aggressive;

when a second event for a second layer has occurred, a second long term performance measure for the second layer is met, and a second short term performance measure for the second layer is met, then selecting a second offset for the second layer so that the selected modulation and coding scheme for the second layer is more aggressive; or when the second event for the second layer has occurred and the second short term performance measure for the second layer is not met, then selecting the second offset for the second layer so that the selected modulation and coding scheme for the second layer is less aggressive.

20. The method of claim 19, wherein the first event corresponds to an occurrence of a measurement of the first long term performance measure in the first layer, wherein the first long term performance measure is the target error rate for the first layer>the estimated error rate for the first layer, wherein the first short term performance measure is a negative acknowledgment and is received in the first layer, wherein the second event corresponds to an occurrence of a measurement of the second long term performance measure in the second layer, wherein the second long term performance measure is the target error rate for the second layer>the estimated error rate for the second layer, and wherein the second short term performance measure is a negative acknowledgment and is received in the second layer.

21. The method of claim 18, wherein computing the offset comprises:
when:
a first event for a first layer has occurred, a first long term performance measure for the first layer is met, and a first short term performance measure for the first layer is met; and
a second event for a second layer has occurred, a second long term performance measure for the second layer is met, and a second short term performance measure for the second layer is met, then
selecting a first offset for the first layer so that the selected modulation and coding scheme for the first layer is more aggressive and selecting a second offset for the second layer so that the selected modulation and coding scheme for the second layer is more aggressive; or
when:
the first event for the first layer has occurred and the first short term performance measure for the first layer is not met; and
the second event for the second layer has occurred and the second short term performance measure for the second layer is not met, then
selecting a first offset for the first layer so that the selected modulation and coding scheme for the first layer is less aggressive and selecting a second offset for the second layer so that the selected modulation and coding scheme for the second layer is less aggressive.

22. The method of claim 18, wherein computing the offset comprises:
when a first event for a first layer has occurred, a first long term performance measure for the first layer is met, and a first short term performance measure for the first layer is met, then selecting a first offset for the first layer so that the selected modulation and coding scheme for the first layer is more aggressive;

when a second event for a second layer has occurred, a second long term performance measure for the second layer is met, and a second short term performance measure for the second layer is met, then selecting a second offset for the second layer so that the selected modulation and coding scheme for the second layer is more aggressive; or when the first event for the first layer has occurred, the first short term performance measure for the first layer is not met, the second event for the second layer has occurred, and the second short term performance measure for the second layer is not met, then selecting the first offset for the first layer so that the selected modulation and coding scheme for the first layer is less aggressive and selecting the second offset for the second layer so that the selected modulation and coding scheme for the second layer is less aggressive.

23. A method for transmitter operations, the method comprising:
determining a measurement of a channel;
determining link adaptation offsets for two layers of the channel, wherein the link adaptation offsets are determined in accordance with an ordering of the two layers;
encoding information in accordance with the link adaptation offsets; and
transmitting the encoded information.

24. The method of claim 23, wherein determining the link adaptation offsets comprises:
computing the link adaptation offsets in accordance with the measurement of the channel and an assumed ordering of the two layers;
determining an actual ordering of the two layers in accordance with the measurement of the channel; and
switching a first link adaptation offset with a second link adaptation offset in response to a determination that the actual ordering of the two layers is different from the assumed ordering of the two layers, wherein the link adaptation offsets include the first link adaptation offset and the second link adaptation offset.

25. The method of claim 24, wherein computing the link adaptation offsets comprises:
determining the first link adaptation offset for a first layer in the assumed ordering of the two layers; and
determining the second link adaptation offset for a second layer in the assumed ordering of the two layers.

26. The method of claim 23, wherein determining the link adaptation offsets comprises:
computing a first set of link adaptation offsets in accordance with the measurement of the channel and a first ordering of the two layers;
computing a second set of link adaptation offsets in accordance with the measurement of the channel and a second ordering of the two layers;
determining an actual ordering of the two layers; and
setting the link adaptation offsets equal to either the first set of link adaptation offsets or the second set of link adaptation offset in accordance with a comparison of the actual ordering of the two layers with the first ordering of the two layers and the second ordering of the two layers.

27. The method of claim 23, wherein determining the link adaptation offsets comprises:
determining an actual ordering of the two layers; and computing the link adaptation offsets in accordance with the measurement of the channel and the actual ordering of the two layers.

* * * * *